United States Patent
Felix et al.

(10) Patent No.: US 12,032,021 B2
(45) Date of Patent: Jul. 9, 2024

(54) METHOD OF TESTING A STACKED INTEGRATED CIRCUIT DEVICE

(71) Applicant: Graphcore Limited, Bristol (GB)

(72) Inventors: Stephen Felix, Bristol (GB); Phillip Horsfield, Bristol (GB)

(73) Assignee: Graphcore Limited, Bristol (GB)

(*) Notice: Subject to any disclaimer, the term of this patent is extended or adjusted under 35 U.S.C. 154(b) by 105 days.

(21) Appl. No.: 17/934,250

(22) Filed: Sep. 22, 2022

(65) Prior Publication Data

US 2023/0114044 A1 Apr. 13, 2023

(30) Foreign Application Priority Data

Oct. 8, 2021 (GB) .................................... 2114437

(51) Int. Cl.
  *G01R 31/3185* (2006.01)
  *G01R 31/317* (2006.01)
  *G01R 31/3177* (2006.01)

(52) U.S. Cl.
  CPC ........ *G01R 31/318555* (2013.01); *G01R 31/31724* (2013.01); *G01R 31/3177* (2013.01)

(58) Field of Classification Search
  CPC ............ G01R 31/31855; G01R 31/31724
  See application file for complete search history.

(56) References Cited

U.S. PATENT DOCUMENTS

| | | | | |
|---|---|---|---|---|
| 7,323,771 B2 * | 1/2008 | Fujita | ............... | G06F 11/261 257/691 |
| 2002/0175348 A1 * | 11/2002 | Stadler | ............... | G01R 31/2818 257/200 |
| 2007/0234168 A1 * | 10/2007 | Moriwaki | ........ | G01R 31/31722 714/742 |
| 2008/0082884 A1 * | 4/2008 | Harada | ............ | G01R 31/31724 714/E11.169 |
| 2018/0076102 A1 * | 3/2018 | Ka | ................... | H01L 27/1251 |

* cited by examiner

Primary Examiner — Joseph D Torres
(74) Attorney, Agent, or Firm — Haynes and Boone, LLP

(57) ABSTRACT

A method for testing a stacked integrated circuit device comprising a first die and a second die, the method comprising: sending from testing logic of the first die, first testing control signals to first testing apparatus on the first die; in response to the first testing control signals, the first testing apparatus running a first one or more tests for testing functional logic or memory of the first die; sending from the testing logic of the first die, second testing control signals to the second die via through silicon vias formed in a substrate of the first die; and in dependence upon the second testing control signals from the first die, running a second one or more tests for testing the stacked integrated circuit device.

23 Claims, 20 Drawing Sheets

Providing from testing logic of the first die, first testing control signals to first testing apparatus on the first die to run a first one or more tests for testing functional logic or memory of the first die. — S1605

Providing from the testing logic of the first die, second testing control signals to the second die via through silicon vias formed in a substrate of the first die. — S1610

1600

METHOD OF TESTING A STACKED INTEGRATED CIRCUIT DEVICE

CROSS-REFERENCE TO RELATED APPLICATIONS

The present application claims priority to United Kingdom Patent Application No. GB2114437.3 filed Oct. 8, 2021, the disclosure of which is hereby incorporated herein by reference in its entirety.

TECHNICAL FIELD

The present disclosure relates to a stacked integrated circuit device and a method of testing the device.

BACKGROUND

In the context of processing data for complex or high volume applications, a work accelerator may be a subsystem to which processing of certain data is offloaded from a host system. Such a work accelerator may have specialised hardware for performing specific types of processing.

In particular, a work accelerator specialised for machine learning applications may have an architecture which supports a high degree of parallelism. One form of parallelism can be achieved by means of a processor comprising an arrangement of multiple tiles on the same chip (i.e. same die), each tile comprising its own respective processing unit and memory (including program memory and data memory). Thus, separate portions of program code can be run in parallel on different ones of the tiles. The tiles are connected together via an on-chip interconnect which enables data to be exchanged between them. Such an accelerator may function as a subsystem for a host system to perform parallel processing of datasets provided to it.

One such specialised work accelerator is a so-called intelligence processing unit (IPU) developed by Graphcore and described in U.S. patent application Ser. No. 16/276,834, which is incorporated by reference. In this architecture, a plurality of processors are arranged in respective columns on the chip. The processing unit has an exchange fabric for exchanging messages between sending and receiving processors in a so-called time deterministic fashion.

An integrated circuit (which may be referred to as a 'chip') is a set of electronic circuits that are manufactured on a single piece of semiconductor material (e.g. silicon). Typically, integrated circuits are produced in large batches on a single large wafer of the semiconductor material, which is then cut into pieces, with each piece containing a copy of the integrated circuit. Each of these pieces is referred to as a die.

Scan chain testing is a known technique for detecting faults in processor circuitry, particularly highly embedded processor circuitry. To perform a scan test, a scan chain (of scan latches or scan flops) is provided on the chip such that each scan latch or scan flop can provide input data and record output data from the processor circuitry to be tested. An automatic test pattern generator can generate a bit pattern which is supplied via an input onto the chip and which is then clocked through the scan chain and the logic circuitry on chip using a processor clock. The output is detected and compared with an expected output for the input pattern. Scan testing is highly effective at detecting that there are faults in on-chip processor circuitry, even when that circuitry is highly embedded.

Another type of testing is Memory Built-In Self Test (MBIT), which is used for detecting faults in memories on a chip. An MBIST controller provides test patterns to a memory under test and receives in response an output from the memory. The controller compares this output with the reference output and indicates if the MBIST has passed or failed.

SUMMARY

According to a first aspect, there is provided a method for testing a stacked integrated circuit device comprising a first die and a second die, the method comprising: sending from testing logic of the first die, first testing control signals to first testing apparatus on the first die; in response to the first testing control signals, the first testing apparatus running a first one or more tests for testing functional logic or memory of the first die; sending from the testing logic of the first die, second testing control signals to the second die via through silicon vias formed in a substrate of the first die; and in dependence upon the second testing control signals from the first die, running a second one or more tests for testing the stacked integrated circuit device.

According to a second aspect, there is provided a stacked integrated circuit device comprising a first die and a second die, the first die comprising testing logic and first testing apparatus, the second die comprising second testing apparatus, wherein the testing logic is configured to: send first testing control signals to the first testing apparatus on the first die to run a first one or more tests for testing functional logic or memory of the first die; and send second testing control signals to the second testing apparatus on the second die via through silicon vias formed in a substrate of the first die, wherein the first testing apparatus is configured to, in response to the first testing control signals, run a first one or more tests for testing functional logic or memory of the first die, wherein the second testing apparatus is configured to, in response to the second testing control signals, run a second one or more tests for testing functional logic or memory of the second die.

According to a third aspect, there is provided a computer program comprising computer readable instructions for testing a stacked integrated circuit device comprising a first die and a second die, wherein the computer readable instructions, when executed by at least one processor of testing logic of the first die, cause a method to be carried out, the method comprising: sending from the testing logic of the first die, first testing control signals to first testing apparatus on the first die to run a first one or more tests for testing functional logic or memory of the first die; and sending from the testing logic of the first die, second testing control signals to the second die via through silicon vias formed in a substrate of the first die, the second testing control signals for controlling testing performed for the stacked integrated circuit device.

According to a fourth aspect, there is provided a non-transitory computer readable medium storing the computer program according to the third aspect.

BRIEF DESCRIPTION OF DRAWINGS

To aid understanding of the present disclosure and to show how embodiments may be put into effect, reference is made by way of example to the accompanying drawings in which.

DETAILED DESCRIPTION

Aspects of the invention have been developed in the context of an architecture having on die parallel processing units. An example of such a processing unit is described with reference to FIG. 1. It will be appreciated, however, that the invention has wider applicability to stacking logic wafers and testing stacked wafers, and is not limited to use with such a processing unit 2. An example of the processing unit 2 is described in more detail in U.S. patent application Ser. No. 16/276,834, which is incorporated by reference.

Figure 1:
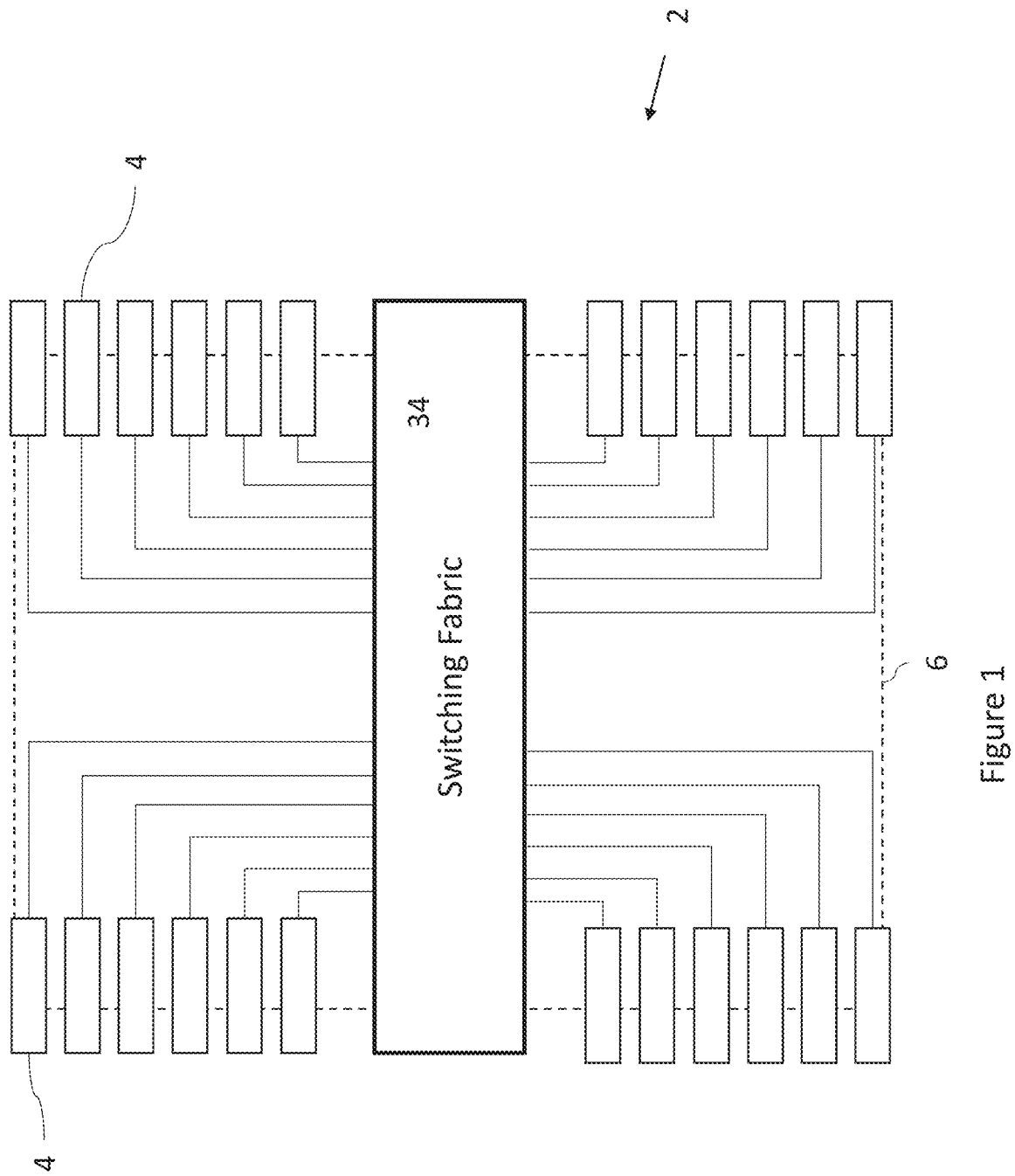
FIG. 1 illustrates an example of a multi-tile processing unit.

Reference is made to FIG. 1, which illustrates an example processing unit 2. This example processing unit 2 is a multi-tile processing unit 2. Each such processing units 2 is formed as part of the processing circuitry of a logic die.

The processing unit 2 comprises an array 6 of multiple processor tiles 4 and an interconnect 34 connecting between the tiles 4. The processing unit 2 may be implemented alone as one of multiple dies packaged in the same IC package. The interconnect 34 may also be referred to herein as the "exchange fabric" 34 as it enables the tiles 4 to exchange data with one another. Each tile 4 comprises a respective instance of an execution unit and memory. For instance, by way of illustration, the processing unit 2 may comprise of the order of hundreds of tiles 4, or even over a thousand. For completeness, note also that an "array" as referred to herein does not necessarily imply any particular number of dimensions or physical layout of the tiles 4.

In embodiments, each processing unit 2 also comprises one or more external links, enabling the processing unit 2 to be exchange data with one or more other processing units (e.g. one or more other instances of the same processing unit 2). These external links may enable the processing unit 2 to be connected to: a host system; and one or more other instances of the processing unit 2 on the same IC package or card, or on different cards. The processing unit 2 receives work from the host, in the form of application data which it processes.

The interconnect 34 is configured to enable the different tiles 4 in the array 6 to communicate with one another. However, as well as there potentially being dependencies between threads on the same tile 4, there may also exist dependencies between the portions of the program running on different tiles 4 in the array 6. A technique is therefore required to prevent a piece of code on one tile 4 running ahead of data upon which it is dependent being made available by another piece of code on another tile 4. This is achieved using a data consistency model.

Figure 2:
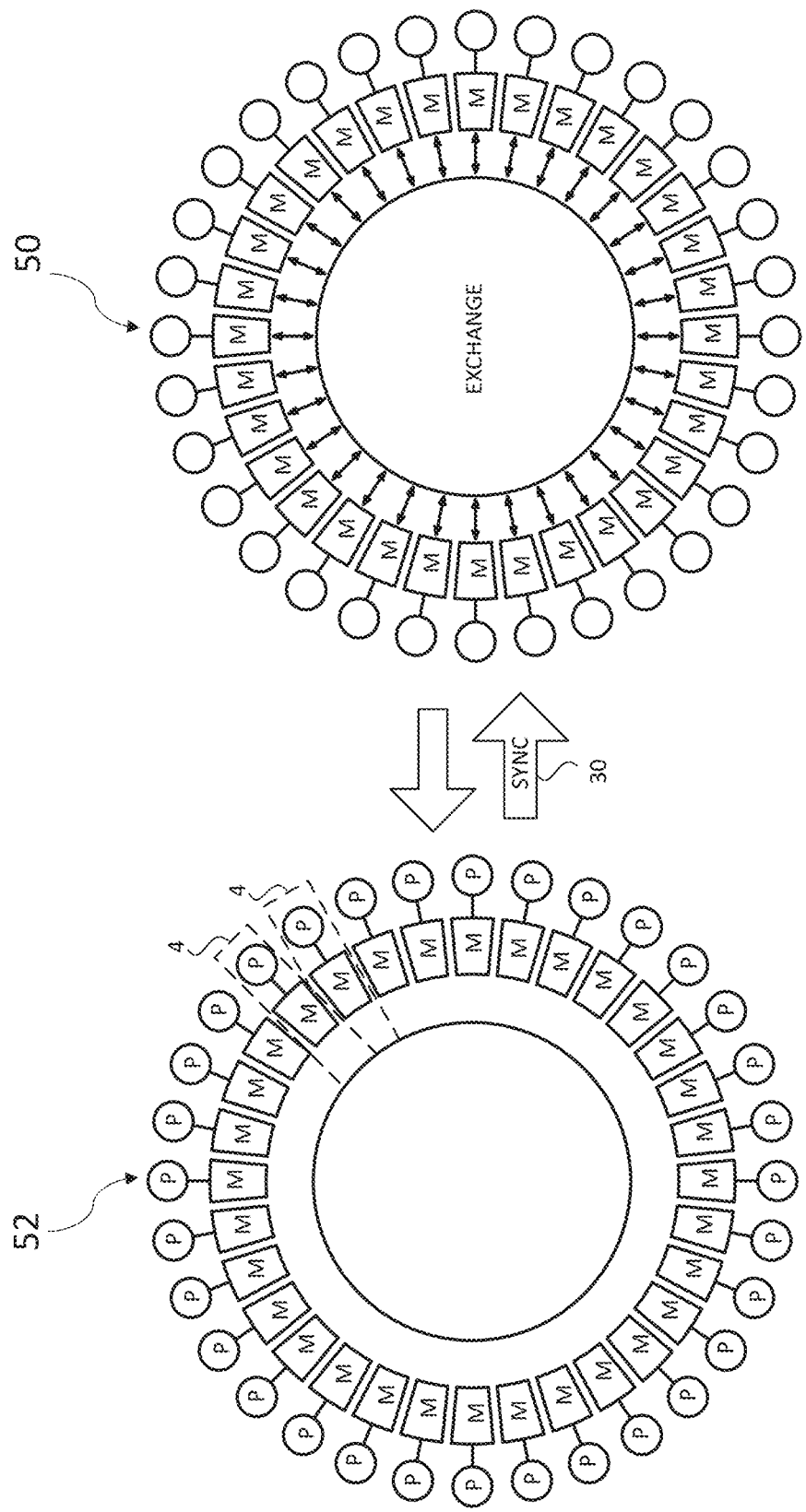
FIG. 2 illustrates an example of a group of tiles alternating between compute and exchange phases separated by barrier syncs.

The protocol is illustrated for example in FIG. 2. The left-hand diagram in FIG. 2 represents a compute phase in which each tile 4 is in a phase where the stateful codelets execute instructions to perform calculations using data held in local memory. Although in FIG. 2 the tiles 4 are shown arranged in a circle, this is for explanatory purposes only and does not reflect the actual architecture.

After the compute phase, there is a synchronisation denoted by arrow 30.

BSP in itself is known in the art. According to BSP, each tile 4 performs a compute phase 52 and an exchange (sometimes called communication or message-passing) phase 50 in an alternating cycle. The compute phase and exchange phase are performed by the tile 4 executing instructions. During the compute phase 52, each tile 4 performs one or more computation tasks locally on-tile, but does not communicate any results of these computations with any others of the tiles 4. In the exchange phase 50, each tile 4 is allowed to exchange (communicate) one or more results of the computations from the preceding compute phase to and/or from one or more others of the tiles 4 in the group, but does not yet perform any new computations that have a potential dependency on a task performed on another tile 4 or upon which a task on another tile 4 might potentially have a dependency (it is not excluded that other operations such as internal control-related operations may be performed in the exchange phase). Further, according to the BSP principle, a barrier synchronization is placed at the juncture transitioning from the compute phase 52 into the exchange phase 50, or the juncture transitioning from the exchange phases 50 into the compute phase 52, or both. That is it say, either: (a) all tiles 4 are required to complete their respective compute phases 52, before any in the group is allowed to proceed to the next exchange phase 50, or (b) all tiles 4 in the group are required to complete their respective exchange phases 50, before any tile 4 in the group is allowed to proceed to the next compute phase 52, or (c) both of these conditions is enforced. This sequence of exchange and compute phases may then repeat over multiple repetitions. In BSP terminology, each repetition of exchange phase and compute phase is referred to herein as a "superstep", consistent with usage in some prior descriptions of BSP. It is noted herein that the term "superstep" is sometimes used in the art to denote each of the exchange phase and compute phase.

One effect of the BSP protocol is to exacerbate the effects of current draw requirements because all or many tiles 4 compute at the same time and exchange at the same time. The current draw requirements are much higher for compute than they are for exchange. Therefore, there is a large load step, corresponding to a large increase in current drawn, when the tiles 4 start their compute phase simultaneously, and a second large load step, this time corresponding to a large decrease in current drawn, when the tiles start their exchange phase simultaneously.

Figure 3:
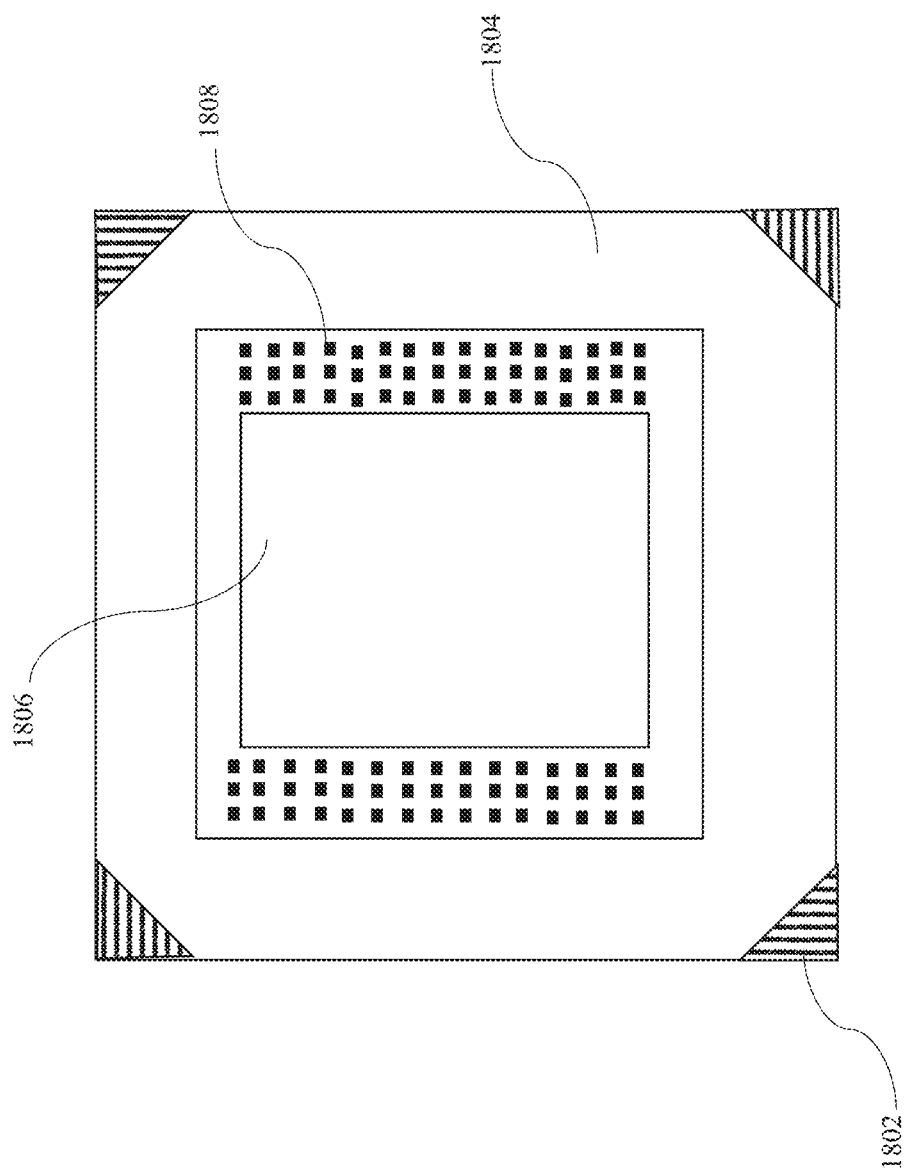
FIG. 3 illustrate an example of a package substrate with an attached chip.

FIG. 3 shows an illustration of a structure comprising a processing unit. A package substrate 1802 forms a base layer onto which components are attached.

A die (or chip) 1806 is placed on to the package substrate 1802. The die 1806 comprises logic which is used to perform computations.

Around the die 1806 is an array of capacitors 1808. The capacitors 1808 are multilayer ceramic capacitors with dimensions of 0.5 mm by 1 mm. These capacitors 1808 are placed on the package substrate 1802 as close to the die 1806 as possible so as to reduce the inductance between the circuits drawing the current and the capacitors 1808. These discrete capacitors 1808 are considered to provide an "on-chip" capacitance.

There is a stiffener ring 1804 around the capacitors 1808. The stiffener ring 1804 is a metal ring, which is attached to the surface of the package substrate 1802 using epoxy glue. The stiffener ring 1804 improves the robustness of the die.

The structure of FIG. 3 is constructed using flip-chip technology, as known in the art. The die 1806 is attached face-down to the package substrate 1802 using solder bumps or C4 balls. These are balls of solder, which are attached to the topside of the chip 1806. Once the die 1806 is in place on the package substrate 1802, the structure is heated such that the C4 balls melt and the die 1806 soldered in place on the package substrate 1802. This process may be referred to as "packaging".

The package substrate 1802 also comprises an array of solder balls. This array is on the underside of the package substrate 1802 and is used to connect the package to a printed circuit board (PCB). These package solder balls are much larger than the C4 balls and have a larger pitch. The C4 balls are a type of connector terminal.

Other types of connector terminals, that is means for connecting the chip to other components, may be used. The form the connector terminals takes may depend on the type of packaging and/or the method of connecting to the packaging. For example, copper pillars are used as the connector terminals when the chip is connected to conventional packaging, and micro-bumps are used as the connector terminals for flip-chip on a silicon interposer.

In some embodiments, an additional logic die is stacked on top of the already present (first) logic die 1806. Vertical stacking allows for very short connections between the two processing units 2. The tiles 4 of the additional processing unit 2 can use the same exchange as the first logic die to exchange signals with other tiles 4.

Figure 5A:
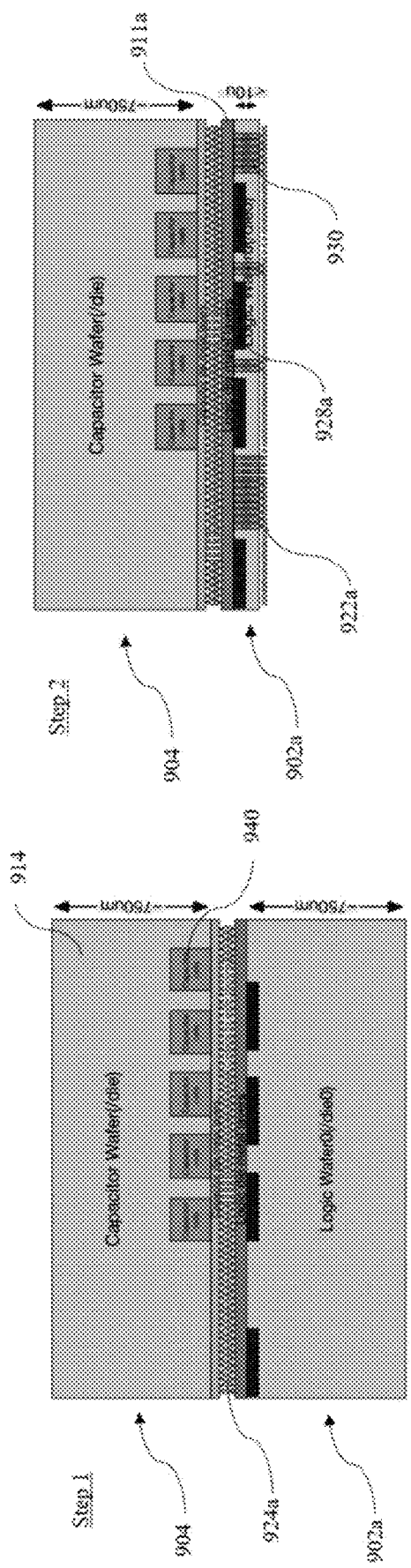
FIG. 5A illustrates the first and second steps of a method for manufacturing a stacked wafer structure from which the stacked integrated circuit device may be obtained.
Figure 5B:
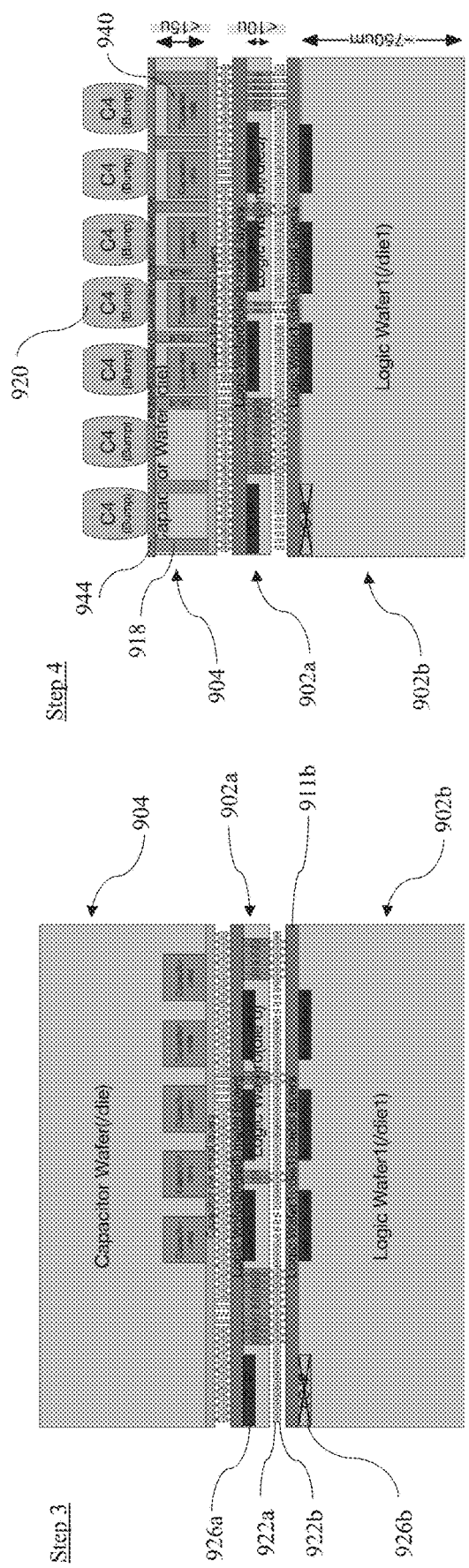
FIG. 5B illustrates the third and fourth steps of a method for manufacturing a stacked wafer structure from which the stacked integrated circuit device may be obtained.

In the present disclosure, wafers are stacked in a wafer-stacking process—an example of which is illustrated by FIGS. 5A and 5B—before being cut into individual stacked integrated circuit devices, also referred to as 3D integrated circuits. FIGS. 5A and 5B show cross-sections of the wafers at various points during the manufacturing process. The cross-sections are partial cross-sections of the wafers, as they show only a part of each wafer, each part being for providing a single die. However, it is understood that each wafer of the stacked wafer structure comprises a plurality of die, such that a plurality of stacked integrated circuit devices are produced by singulation of the final bonded wafer structure. Each stacked device resulting from the manufacturing process comprises the features shown under step 4 in FIG. 5B at the end of the manufacturing process.

Prior to the method shown in FIGS. 5A and 5B, a supporting wafer 904 and logic wafers 902a, 902b are fabricated. In the example shown, the supporting wafer 904 is a capacitor wafer 904, which comprises capacitor cells (which may also be referred to as capacitive elements). However, in other embodiments the supporting wafer 904 may comprise different elements (formed in either the substrate 914 or the metal layers 410 of the supporting wafer 904) that support the logic formed in the logic wafers 902a, 902b. The use of a capacitor wafer and corresponding capacitor die for use with a single logic die is described in more detail in U.S. application Ser. No. 16/804,955, which is incorporated by reference.

The logic wafers 902a, 902b are wafers comprising computational logic, both of which are described in more detail below. In some embodiments, the logic wafers 902a, 902b are substantially identical such that the arrangement of logic within each logic wafer 902a, 902b is substantially the same. In other embodiments, there may be some differences between the processing circuitry formed in each of the logic wafers 902a, 902b such that some processing components are formed in the metal layers of one of the logic wafers 902a, 902b that are not formed in the other of the wafers.

Each of the wafers 902a, 902b, 904 comprises a substrate on which is formed a plurality of metal layers. A front surface of each wafer may be defined as the top surface of the metal layers. A back surface of each wafer may be defined as the surface of the substrate, which is on the opposite side of the substrate to the metal layers.

At step 1, bonding layers 921a/921b are formed on the front surface (i.e. inner facing surface) of the supporting wafer 904 and the front surface of a first logic wafer 902a. The supporting wafer 904 is then stacked on top of the first logic wafer 902a, with the front surface of the supporting wafer 904 being aligned with, and connected to, the front surface of the first logic wafer 902a. In other words, the metal layers of the supporting wafer 904 face the metal layers of the logic wafer 902a. The wafers 904, 902a are positioned such that connectors 924a (discussed in more detail later) of the respective bonding layers are aligned.

After completing this step to bond together the two wafers 904, 902a, each of the wafers 904, 902a has a depth of approximately 750 μm, which is a self-supporting depth.

At step 2, once bonded to the supporting wafer 904, the first logic wafer 902a is thinned. The thinning of the wafer 902a comprises removing part of the substrate. The thinning may be achieved using any known technique to achieve thinning of a substrate to achieve a desired flatness. For example, the wafer 902a may be thinned by first using a mechanical grinding process to remove most of the material and then finishing the thinning using a poligrind process. Other suitable known techniques, such as chemical mechanical polish, may be used.

The first logic wafer 902a is thinned after stacking with the supporting wafer 904 so that the supporting wafer 904 can provide sufficient support to the bonded structure (i.e. comprising the thinned logic wafer 902a and the supporting wafer 904) for the subsequent fabrication steps. The first logic wafer 902a is thinned to be only a few microns thick, for example the thinned thickness may be less than 10 μm, and in the range of 3 to 10 μm. The thinned logic wafer 902a is said to have a non-self-supporting depth because the thinned logic wafer 902a would not be able to support itself without some kind of supporting layer. After completing step 2, the supporting layer for the structure is the supporting wafer 904, which has a self-supporting depth. The thinned logic wafer 902a has a smaller depth than the self-supporting supporting wafer 904.

TSVs 930 are formed in the thinned logic wafer 902a after it has been thinned. These TSVs 930 extend from the metal layers 911a of the first logic wafer 902a to a back surface of the thinned logic wafer 902a. These TSVs 930 are formed using a conventional/ordinary reactive ion etch (RIE).

The metal layers 911a of the first logic wafer 902a comprise logic circuitry 926a, 928a. Likewise, the metal layers 911b of the second logic wafer 902b (which is to be bonded to the other wafers at step 3) comprises logic circuitry 926b, 928b. The logic circuitry 926a of the first logic wafer 902a comprises a separate set (e.g. a separate processing unit 2) of the logic circuitry 926a for each of the die to be produced (when singulation is performed) from the first logic wafer 902a. The logic circuitry 926b of the second logic wafer 902b comprise a separate set of (e.g. a separate processing unit 2) of the logic circuitry 926b for each of the die to be produced (when singulation is performed) from the second logic wafer 902b.

The logic circuitry 926a, 928a, in addition to being formed in the metal layers 911a, may also comprise parts that are embedded within the substrate of the first logic wafer 902a. In this case, the TSVs 930 are arranged within the thinned logic wafer 902a such that they avoid parts of the logic circuitry 926a, 928a embedded in the substrate of the first logic wafer 902a.

The TSVs 930 are etched from the back surface of the thinned logic wafer 902a, since they do not extend through the metal layers 911a of the first logic wafer 902a. These TSVs 930 can therefore be referred to as backside TSVs (BTSVs). By forming the TSVs 930 after wafer thinning, the TSVs 930 may be provided with a finer pitch than if the TSVs 930 were etched in the unthinned wafer. For example, the TSVs 930 may be provided with a pitch of around of 2 μm, which is approximately five times greater (implying 25 times the density) than if the TSVs 930 are formed without thinning. Providing the TSVs with a finer pitch enables a greater degree of connectivity between the metal layers 911a in the first logic wafer 902a, and the metal layers 911b in the second logic wafer 902b. This enables more complex circuitry with greater I/O requirements to be supported in the second logic wafer 902b. Furthermore, thinning the first logic wafer 902a prior to forming the TSVs 930 enables an ordinary reactive ion etch (RIE) to be used for forming the TSVs 930, rather than a multi-stage deep reactive ion etch, hence resulting in reduced manufacturing costs.

Figure 4:
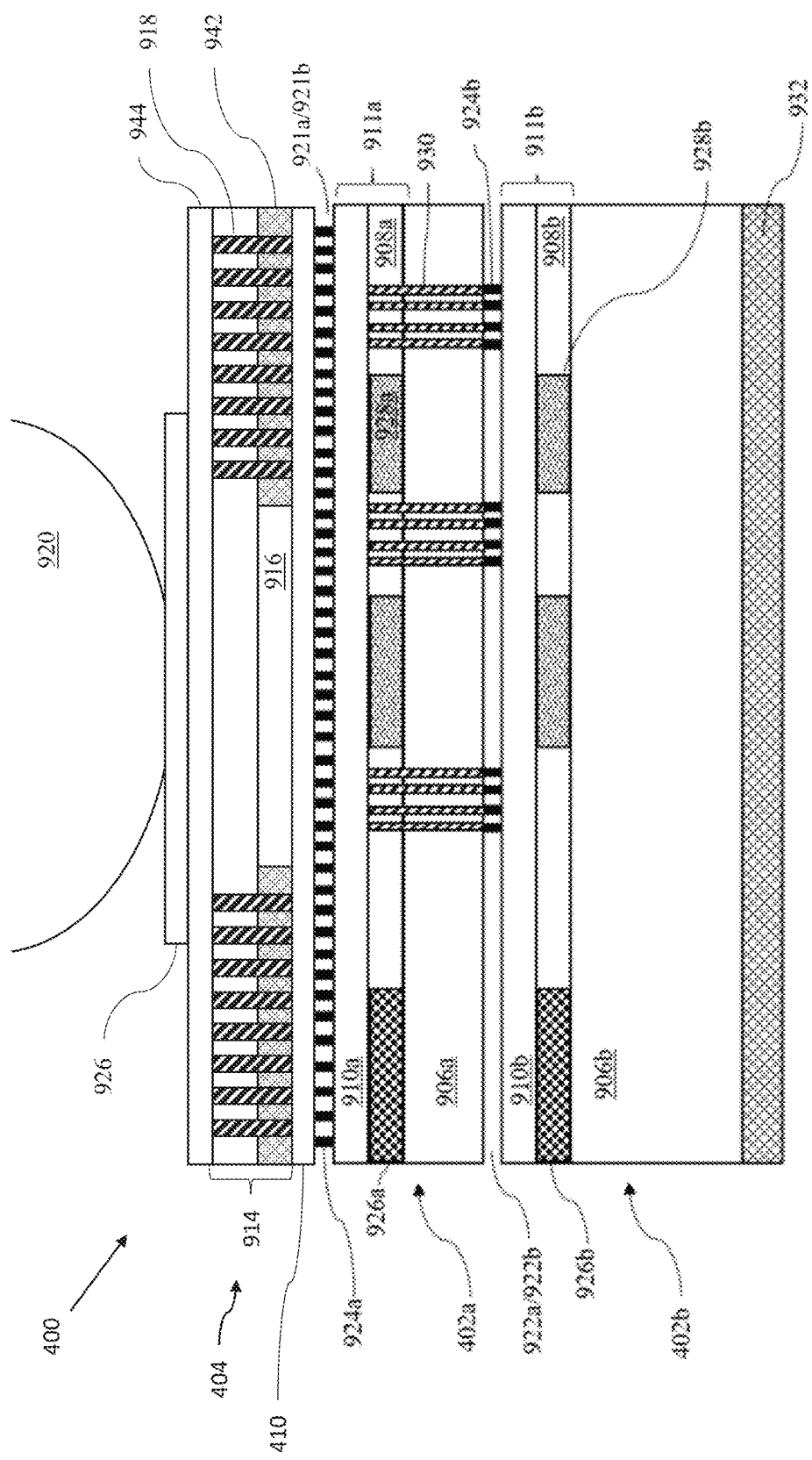
FIG. 4 is a cross-section of part of a stacked integrated circuit device.

A second bonding layer 922a is formed on the back surface of the thinned logic wafer 902a after the TSVs 930 have been formed. The second bonding layer 922a comprises connectors 924b. The connectors 924b may be provided over the entire area of the back surface of the first logic wafer 902a, but only electrically connected at the locations of the TSVs 930, as shown in FIG. 5A. Alternatively, the connectors 924b may be provided only in the required locations as shown in FIG. 4.

At step 3, a corresponding bonding layer 922b is formed on a front surface of a second logic wafer 902b. The bonding layer 922b also comprises connectors 924b. The thinned first logic wafer 902a, already being stacked with the supporting wafer 904, is then stacked on top of the second logic wafer 902b, such that the connectors 924b of the bonding layers 922a, 922b are aligned. The connectors 924b of the bonding layer 922b of the second logic wafer 902b are electrically connected to a metal layer 910b of the second logic wafer 902b at the location of the TSVs 930 formed in the thinned first logic wafer 902a.

An I/O IP 926b of the second logic wafer 902b is not connected to the first logic wafer 902a, and therefore is not connected to the supply voltage. The I/O IP 926a, 926b is designed for conventional packaging, in which logic wafers are not stacked. These are high speed external interfaces with large amounts of in-built analogue and digital processing. The I/O IP 926b of the second logic wafer 902b is positioned directly below an I/O IP 926a of the thinned logic wafer 902a. There is generally insufficient space within the I/O IP 926a, 926b for TSVs to be formed. Therefore, it is difficult to power the identical I/O IP 926b of the second logic wafer 902b sat directly below that of the first logic wafer 902a. There is little need for the I/O IP 926b of the second logic wafer 902b to be used, as discussed below, and therefore it is not connected to the first logic wafer 902a. This is indicated in FIG. 5B by the I/O IP 926b of the second logic wafer 902b being crossed out.

As a result, any input/output required for the second logic wafer 902b must be provided via the I/O IP 926a of the thinned logic wafer 902a.

The I/O IP 926b of the second logic wafer could, alternatively, be removed. However, this would require a different stencil to be used when manufacturing the second logic wafer 902b to that used to manufacture the first logic wafer 902a. This would be both more expensive and time consuming.

Once the second logic wafer 902b, with a self-supporting depth of about 750 μm, has been bonded to the thinned logic wafer 902a, the second logic wafer 902b can provide the support required for the other wafers 902a, 904 of the stack.

At step 4, the supporting wafer 904 is thinned to a depth of less than 15 μm using any suitable thinning method, as set out above in the discussion of thinning the first logic wafer 902a. The second logic wafer 902b, which has not been thinned, provides support for the wafer stack at this step. Once thinned, the supporting wafer 904 is thinner than the second logic wafer 902b.

TSVs 918 are also formed in the now thinned supporting wafer 904. As in the first logic wafer 902a, the TSVs 918 are BTSVs formed using a conventional RIE. The TSVs 918 have a pitch of around 10 μm. The TSVs 918 in the example of FIG. 5A/5B are formed through the substrate 914 of the supporting wafer 904.

As discussed, FIG. 5B shows an example in which the supporting wafer 904 comprises capacitive elements 940. As shown, the capacitor cells 940 are positioned in trenches in the substrate of the supporting wafer 904. The TSVs 918 are arranged such that they avoid the capacitors 940 in the supporting wafer 904.

A redistribution layer 944 is provided on the outer facing surface of the supporting wafer 904. Connector terminals 920 are then deposited into the exposed surface of the redistribution layer 944. In the example of FIG. 5B, these connector terminals 920 take the form of C4 balls. The C4 balls 920 have a pitch of around 150 μm and about 40000 C4 balls 920 are provided on the stacked wafer structure, which has a diameter of about 300 mm.

In the example of FIGS. 5A and 5B, the TSVs 918 are not positioned directly below the C4 balls 920. The reason for this is that the C4 balls 920 sit on aluminium pads, which are flat structures that are difficult to form over TSVs 918. Therefore, the capacitor parts 940 are positioned beneath the C4 balls 920 and the TSVs 918 are arranged between the C4 balls 920.

Current is provided from the C4 balls 920 to the TSVs 918 via the redistribution layer 944, which acts to redistribute the current over the outer facing surface of the supporting wafer 904 such that is it provided to the appropriate TSVs 918 for supply to the underlying logic wafers 902a, 902b.

A heat sink 932 (not shown in FIGS. 5A and 5B) may also be provided in step 4 on the back surface of the second logic wafer 902b.

In some embodiments, more than two logic wafers 902a, 902b may be required. One or more additional logic wafers can be added to the stacked die. In such an embodiment, the second logic wafer 902b is thinned after it has been bonded to the first logic wafer 902a, and before the supporting wafer 904 is thinned. As a result, the second logic wafer 902b is thinner than the supporting wafer 904, which provides support for the bonded wafers. TSVs are then provided in the thinned second logic wafer 902b. These would be formed using the same technique and would preferably be formed directly below the TSVs 930 in the first logic wafer 902a. Thereafter, a third bonding layer is provided on the back surface of the thinned second logic wafer 902b, and an identical bonding layer provided on a front surface of a third logic wafer. These second and third logic wafers are then bonded together, with the front surface of the third logic wafer aligned with the back surface of the thinned second wafer.

If any more additional logic wafers are required, the process is repeated, with the last logic wafer added to the stack being thinned and TSVs provided therein, before bonding the next logic wafer to the back surface of that logic wafer. During the process of adding more logic wafers, the supporting wafer continues to provide structural support for the stacked wafers.

The supporting wafer is thinned after the last of the logic wafers is bonded to the stacked wafer structure.

After the last required logic wafer is stacked, step 4 as set out above is performed, with the supporting wafer 904 being thinned, the TSVs 918 etched, and the redistribution layer 944 and C4 balls 920 provided on the outer facing surface. The heat sink is provided on the back surface of the logic wafer furthest from the supporting wafer 902, i.e. the logic wafer which was added last to the stack. This furthest logic wafer is not thinned, and therefore provides the structural support for the stacked wafers.

As set out above, each wafer 902a, 902b, 904 is stacked before it is thinned, such that each wafer 902a, 902b, 904 has a depth of about 750 µm when it is bonded to another wafer. The product resulting from the stacking of the wafers 902a, 902b, 904 is said to have a self-supporting depth when it has a thickness of at least 400 µm, and preferably greater than 700 µm, because the depth is sufficient that the product resulting from the stacking of wafers 902a, 902b, 904 can support itself without an additional substrate.

After the C4 balls 920 and heat sink have been provided, the stacked wafers are singulated. That is, the stacked wafers are cut into individual die stacks, each of which comprise identical sets of circuitry. The features shown in FIG. 5B as being part of the wafer at the end of step 4 are also features of each of the individual die resulting from the singulation process.

The connectors 924a are aligned so that the required current and signals can be provided to the logic wafers 902a, 902b. Alignment can be achieved by providing alignment markers on the wafers 902a, 902b, 904. An infrared light can be used to see through the wafers, and ensure that the alignment markers on the wafers 902a, 902b, 904 are aligned as desired.

By stacking logic wafers 902a, 902b, rather than logic die, performance of the resultant computer structure is improved. By stacking wafers as set out above, where TSVs are provided once the wafers have been greatly thinned, the pitch of the TSVs is very fine. Therefore, more than 100000 TSVs used for signalling between die can be provided. This may not be possible with die stacking technology, because the die are too thick to allow for such a fine pitch of TSVs to be etched. The finer pitch of TSVs results in improved connectivity between the die, such that the performance is improved.

As described above, the supporting wafer 904 may be provided with capacitor cells 940. These capacitor cells 940 are circuit elements that are electrically connected to the power supply via the TSVs 918 and the C4 bumps 920. The cells are connected in parallel with the circuitry in the metal layers 911a, 911b of the logic wafers 902a, 902b and enable large load steps (e.g. when switching between an exchange phase and a compute phase) to be handled.

Once the product resulting from stacking the wafers 904, 902a, 902b has been formed as described, the wafers are singulated into separate die. Each separate die has the same layer structure illustrated under step 4 in FIG. 5B. Therefore, in the preceding discussion of the layer structure, discussion of the arrangement of the supporting wafer 904, first logic wafer 902a, and second logic wafer 902b also applies to the arrangement of the resulting top die, first logic die, and the second logic die.

Reference is made to FIG. 4, which illustrates a cross-section of a stacked integrated circuit device 400, which may be produced from dicing the stacked wafer structure produced from the process described above with respect to FIGS. 5A and 5B. The device 400 may also be known as a three dimensional integrated circuit 400. The cross-section shown in FIG. 4 is only partial, since it shows only a part of the device 400 including only a single C4 ball 920. However, each such device 400 would include a plurality of such C4 balls, rather than only a single C4 ball.

The stacked device 400 comprises two logic die 402a, 402b and a top die 404. The top die 404 may also be referred to as a first die 404. In the example shown in FIG. 4 and discussed herein, the top die 404 comprises a capacitor part 916 comprising capacitive elements. However, in other embodiments the top die 404 may comprise other circuit elements that support the operation of the circuitry in the logic die 402a, 402b. The top die 404 is formed from the supporting wafer 904, which has been discussed above.

The first logic die 402a is produced from the first logic wafer 902a when the stacked wafer structure resulting from step 4, and described with respect to FIG. 5B, is diced into a plurality of such stacked devices 400. The second logic die 402b produced from the second logic wafer 902b when the stacked wafer structure is diced into a plurality of such devices 400. The top die 404 (which may also be referred to as the first die 404 or supporting die 404) is produced from the supporting wafer 904 when the stacked wafer structure is diced. Since the stacked device 400 is produced from dicing the stacked wafer structure, it comprises many of the same features described above with respect to FIGS. 5A to 5B as being features of the stacked wafer structure.

The logic die 402*a*, 402*b* are die comprising computational logic. The supporting die 404 is a die containing circuit elements (e.g. capacitors cells) that support the computational logic in the logic die 402*a*, 402*b* Each of the die 402*a*, 402*b*, 404 comprises a substrate and a plurality of metal layers. A front surface of each die may be defined as the top surface of the metal layers. A back surface of each die may be defined as the surface of the substrate, which is on the opposite side of the substrate to the metal layers.

A bonding layer 921*a* formed on the front surface of the top die 404, together with a bonding layer 921*b* formed on the front surface of a first logic die 402*a*, bonds together the top die 404 and the first logic die 402*a*. The front surface of the top die 404 is aligned with, and connected to, the front surface of the first logic wafer 402*a*. In other words, the front surface of the metal layers of the top die 404 face and are bonded to the front surface of the metal layers of the logic die 402*a*.

The top die 404 and the first logic die 402*a* have both been thinned as part of the manufacturing process as described. As a result, each may have a depth that constitutes a non-self-supporting for a wafer. For example, the first logic die 402*a* may have a thickness in the range of 3 to 10 μm. The top die 404 may have a thickness of about 15 μm.

The second logic die 402*b* may retain the depth (e.g. about 750 μm) of the wafer from which it is constructed. This depth is self-supporting for the wafer from which the second logic die 402*b* is constructed and provides support for the wafer structure prior to singulation.

The first logic die 402*a* comprises TSVs 930, which connect the metal layers 911*a* to the back surface of the substrate 906*a*. These TSVs 930 extend from the metal layers 911*a* of the first logic die 402*a* to a back surface of the first logic die 402*a*. The first logic die 402*a* comprises logic circuitry 926*a*, 928*a*. The logic circuitry 926*a*, 928*a* is formed at least partly in the metal layers 911*a*, and may also comprise parts that are embedded within the substrate of the first logic die 402*a*. In this case, the TSVs 930 are arranged within the logic die 402*a* such that they avoid parts of the logic circuitry 926*a*, 928*a* embedded in the substrate of the logic die 402*a*.

A second bonding layer 922*a* on the back surface of the first logic die 402*a* bonds together the first logic die 402*a* and the second logic die 402*b*. The back surface of the first logic die 402*a* is aligned with, and connected to, the front surface of the second logic wafer 402*b*. In other words, the front surface of the metal layers 911*b* of the second logic die 402*b* face and are bonded to the substrate of the first logic die 402*a*.

A redistribution layer 944 is provided on the outer facing surface of the top die 404. C4 balls 920 are then deposited onto the exposed surface of the redistribution layer 944. In FIG. 4, only a single C4 ball 920 is shown, but a plurality of such balls would be present on the back surface of the top die 404.

TSVs 918 are also formed in the substrate 914 of the top die 404. These TSVs 918 connect the redistribution layer 944 to the metal layers 410 of the top die 404.

In the example of FIG. 4, the TSVs 918 are not positioned directly below the C4 balls 920. The reason for this is that the C4 balls 920 sit on aluminium pads, which are flat structures that are difficult to form over TSVs 918. Therefore, the capacitor parts 916 are positioned beneath the C4 balls 920 and the TSVs 918 are arranged between the C4 balls 920. Current is provided from the C4 balls 920 to the TSVs 918 via the redistribution layer 944, which acts to redistribute the current over the outer facing surface of the top die 404, such that is it provided to the appropriate TSVs 918 for supply to the underlying logic die 402*a*, 402*b*.

A heat sink 932 may also be provided on the back surface of the second logic die 402*b*.

In some embodiments, the device 400 comprises one or more additional logic die in addition to the first logic die 402*a* and the second logic die 402*b*. In such a case that the device 400 comprises a third logic die, the second logic die 402*b* is thinned (as part of the manufacturing process performed prior to singulation) such that it is has a non-self-supporting depth for a wafer. The second logic die 402*b* may, like the first logic die 402*a*, have a thickness of 3 to 10 μm. The third logic die is attached to the second logic die 402*b*, such that the front surface of the metal layers of the third logic die is bonded to the back surface of the second logic die 402*b*. The device 400 may continue to be extended in this way by thinning and adding as many logic die as required.

The arrangement of the die 404, 402*a*, 402*b* shown in FIG. 4 shows the distributed top die 404 forming the top of the stacked device 400, whilst the second logic die 402*b* forms the bottom of the device 400. The thinned first logic die 402*a* is sandwiched between the top die 404 and second logic die 402*b*. When attached to the PCB for use, the stack will be inverted, with the top die 404 closest to the PCB. It will be appreciated therefore that the terms "on top", "below", "top" and "bottom" used herein do not necessarily define any particular orientation, but rather defines a relative position of layers to one another.

Each of the logic die 402*a*, 402*b* comprises several layers. The logic die 402*a*, 402*b* differ in their depth, with the second logic die 402*b* having a greater depth than the first logic die 402*a*. The bottom layer of each logic die 402*a*, 402*b* is a substrate 906*a*, 906*b*. This is the layer of the thinned logic die 402*a*, which is less deep than that of the second logic die 402*b*.

A logic layer 908*a*, 908*b* sits on top of each of the substrate layers 906*a*, 906*b*. The logic layers 908*a*, 908*b* comprise processing circuitry, such as FETs 928*a*, 928*b* and I/O IPs 926*a*, 926*b*, which perform computations. Each of the logic layers 908*a*, 908*b* of a device 400 may comprise a processing unit 2, described above with respect to FIG. 1.

Top metal (Mr) layers 910*a*, 910*b* are added on top of the logic layers 908*a*, 908*b*. The top Mr layers 910*a*, 910*b* provide the front surfaces of each of the logic die 402*a*, 402*b*. Together, the logic layer 908*a* and top metal layer 910*a* constitute the metal layers 911*a*. Similarly, the logic layer 908*b* and top metal layer 910*b* together constitute the metal layers 911*b*.

The top die 404 is located on top of the thinned logic die 402*a*. The top die 404 may be face-down, such that an exposed ("outer facing") surface of the die 404, which is not in contact with a logic die, is a backside of the die. The example shown in FIG. 4 shows the top die 404 to be face-down, with the backside of the die exposed and the frontside of the die being an "inner facing" surface which faces the thinned logic die 402*a*.

The top die 404 further comprises metal layers 410 located at the frontside of the die, such that the inner facing surface of the top die 404 is the front surface of the metal layers 410 of the top die 404.

An under ball metallisation (UBM) layer 926 is formed on the outer facing surface of the top die 404. The UBM layer 926 is a pad on the surface of the top die 404, onto which a C4 ball 920 is deposited. The stacked die 404, 402*a*, 402*b* can then be connected to external circuitry using a controlled collapse chip connection, or "flip chip", method, as known in the art. Although only one pad 926 and C4 ball is shown in FIG. 4, the outer facing surface of the top die 404 would be provided with a plurality of such pads 926 and C4 balls 920. The C4 balls 920 form the connections between the stacked device 400 and the external circuitry. It will be appreciated that, in embodiments using different types of connector terminals, there may not be a UBM layer 926.

The top die 404 comprises a substrate 914, which may be made of silicon. Formed in the substrate 914 is a capacitor layer.

The substrate 914 has the through silicon vias (TSVs) 918 formed therein. These provide connections between the C4 balls 920 and the logic die 402a, 402b. Note, each C4 ball 920 is associated with multiple TSVs 918 located in proximity to that C4 ball 920.

The capacitor layer may comprise two different parts: capacitor parts 916 and capacitor free parts 942. The TSVs 918 that connect the C4 ball 920 to the metal layer 410 of the top die 404 are provided in the capacitor free parts 942.

The remaining area of the capacitor layer comprises the capacitor parts 916. This area comprises capacitive elements which, in the example of FIG. 4, have a capacitance of order 1/μm. The capacitor parts 916 provide a capacitor array.

The capacitor layer (formed of capacitor parts 916 and capacitor free parts 942) is about 2 μm thick. The capacitor layer 916 may be coated with a metal oxide.

The first logic die 402a also comprises TSVs 930 formed within the substrate 906a at locations at which no logic is present. These provide connections between the metal layers 911a of the logic die 402a and the top metal layer 910b of the second logic die 402b, and thus enable a connection between the C4 balls 920 and the second logic die 402b.

Bonding layers 921a/921b, 922a/922b provide connections between pairs of die. These bonding layers 921a/921b, 922a/922b provide connections between the top die 404 and the first logic die 402a, and between the first logic die 402a and the second logic die 402b. Although shown as a single layer in FIG. 4, there may be a bonding layer 921a/921b, 992a/992b formed on each of the die 402a, 402b, 404 to be bonded together. The bonding layers 921a/921b, 992a/992b of the die 402a, 402b, 404, which are to be bonded together are mirror images of each other to provide the connections required. An array of connectors 924a, 924b are formed at the bonding layers 921a/921b, 992a/992b. These connectors provide the electrical connection between the top die 404 and the thinned logic die 402a, and the thinned logic die 402a and the second logic die 402b, such that the supply voltage connected to the C4 balls on the upper side of the structure can be supplied to the thinned logic die 402a.

An example embodiment of the top die 404 is described in more detail in U.S. application Ser. No. 16/804,955, which is incorporated by reference.

Once the wafers 904, 902a, 902b have been stacked and singulated, the resultant stacked logic die 402a, 402b are tested. Embodiments of the application make use of testing logic on the first logic die 402a for testing the logic and memory on both of the die 402a, 402b. The testing performed includes scan testing (e.g. via LBIST) to test functional logic of the die 402a, 402b, and the testing of memory (e.g. via MBIST) of the die 402a, 402b.

Scan testing is a known technique for detecting faults in processor circuitry, particularly highly embedded processor circuitry. To perform scan tests of the logic in the die 402a, 402b, multiple scan chains (of scan latches or scan flops) are provided on each of the die 402a, 402b. In each such scan chain, scan latches or scan flops provide input data and record output data from the processor circuitry to be tested.

A bit pattern (known as a test pattern) is a provided and clocked through the scan chain and the logic circuitry using a processor clock. The output from the scan chain is obtained and compared with an expected output for the input pattern. Scan testing is highly effective at detecting that there are faults in on-chip processor circuitry, even when that circuitry is highly embedded.

Different forms of scan chain testing are known. A common form of scan testing is Logic Built in self-test (LBIST), in which the test pattern is generated randomly by an automatic test pattern generator. Other types of scan chain testing, in which the test pattern is generated manually, are also known. This manual approach is useful when testing circuitry for which coverage may be difficult to achieve using randomly generated test patterns. Both types of testing may be applied to test the logic of the die 402a, 402b.

Figure 6:
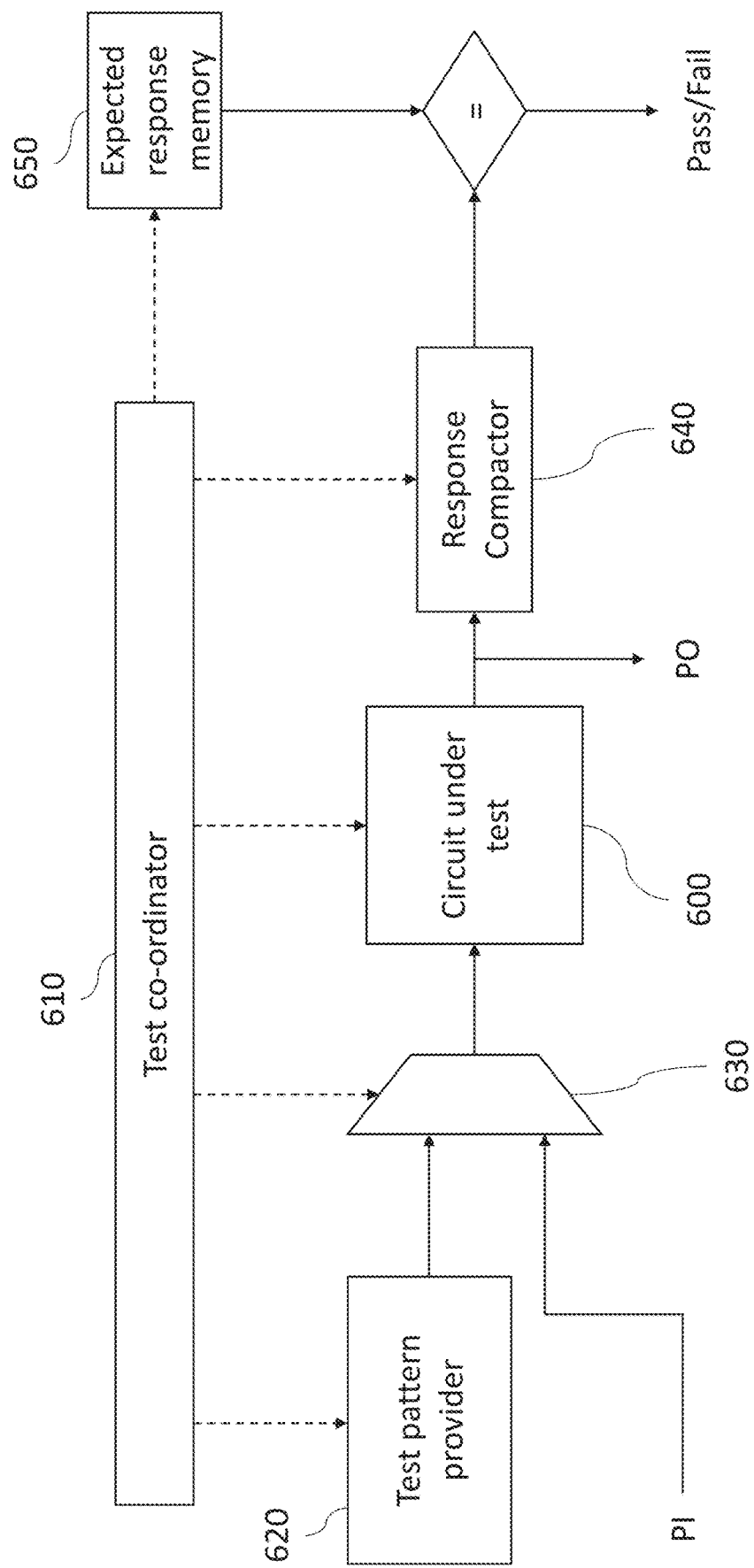
FIG. 6 is a schematic diagram of an apparatus for testing a circuit under test.

Reference is made to FIG. 6, which illustrates an example testing infrastructure for performing scan chain testing of a circuit under test 600. The testing infrastructure includes a test co-ordinator 610 for controlling the testing process. The testing infrastructure includes a circuit under test 600, which will be exposed to test patterns from the test pattern provider 620 in order to test the functional logic in the circuit under test 600. The test pattern provider 620, in addition to supplying the test patterns for input to the scan chains of the circuit 600, may generate the test patterns itself. Alternatively, the test pattern provider 620 may receive the test patterns from a distinct test pattern generator.

As shown in FIG. 6, a multiplexer 630 is provided for selecting between two different inputs to the circuit under test 600. The multiplexer 630 is controlled by the test co-ordinator 610. The multiplexer 630 can receive as inputs, either a primary input (PI) or a test pattern from the test pattern provider 620. The primary input is an input received during normal operation of the circuit under test 600. In normal operation, the circuit under test 600 processes this primary input to produce a primary output (PO).

When a scan test of logic of the circuit under test 600 is to be run, the test co-ordinator 610 controls the mux 630 to select the input for receiving data from the test pattern provider 620. The test co-ordinator 610 causes the test pattern provided 620 to provide test data to a scan chain of the circuit under test 600. After the test data is provided to the scan chain of the circuit under test 600, the test co-ordinator 610 causes the test data to be clocked through the logic circuitry of the circuit under test 600. The test co-ordinator 610 then causes the response of processing the test data to be read out of the circuit under test 600 and provided to the response compactor 640 of the testing infrastructure. The response compactor 640 processes the output to produce response data dependent on the output, but being smaller in size than the output, so as to make the operation of comparing the response to the expected response less intensive. The output of the response compactor 640 may be referred to as the 'compacted response'. The expected compacted response is stored in memory 650. This expected compacted response is compared to the compacted response by the testing infrastructure. If a match to the expected compacted response is found by the testing infrastructure, the circuit under test 600 passes the test. If a match is not found, the circuit under test 600 fails the test.

Figure 7:
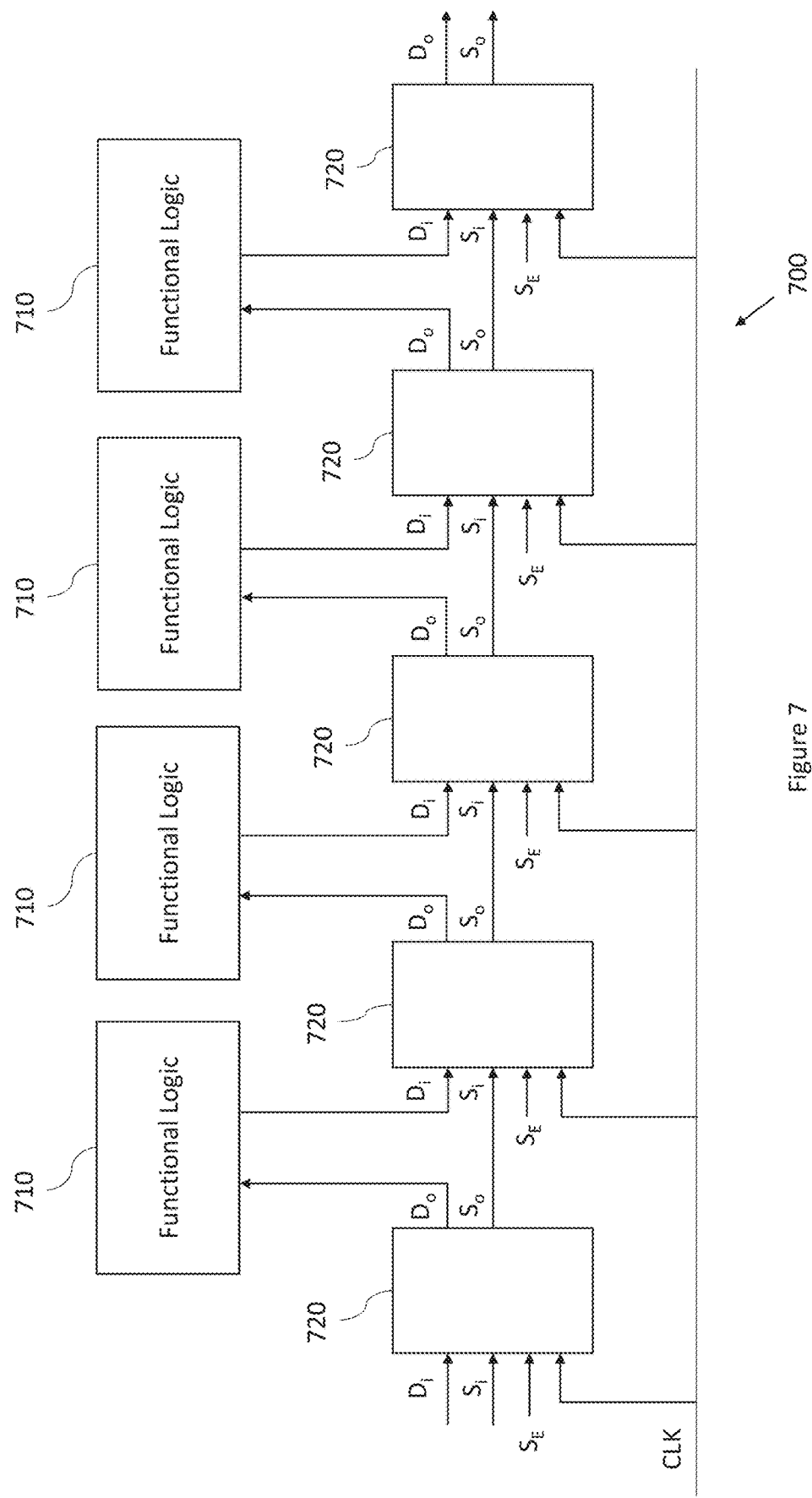
FIG. 7 is a schematic diagram of a scan chain for testing functional logic of a circuit under test.

Reference is made to FIG. 7, which illustrates an example of a scan chain 700 for testing functional logic 710 of the circuit under test 600. The scan chain 700 and the functional logic 710 are both part of the circuit under test 600. The scan chain 700 comprises a plurality of flip flops 720. Each of the flip flops 720 is used during normal operation of the circuit under test for holding bits of data between processing by different pieces of functional logic 710. Each flip flop 720 receives a bit of data, which it holds for a single clock cycle before outputting that bit of data unchanged. The flip flops 720 receive data processed during normal operation of the circuit 600 at their functional data inputs (shown as $D_i$) and output this data one clock cycle later on their functional data outputs ($D_o$).

Although in FIG. 7 a piece of functional logic 710 is shown between each of the flip flops 720, in some cases, data may pass between two of the scan flip flops 720 without being processed by functional logic 710.

To test the functional logic 710, test data is provided into the scan chain 700 from the test pattern provider 620. As shown, each flip flop 720 comprises a scan data input ($S_i$) for receiving scan data and a scan data output ($S_o$) for outputting the scan data. This test data is provided to a first flip flop in the scan chain 700 and clocked through the flip flops 720. As a result, the flip flops 720 store different bits of the test data, which takes the form of a test vector.

As shown, each flip flop 720 also comprises a scan enable input ($S_E$). The scan enable input receives a signal from the test co-ordinator 610. The signal received at the scan enable input determines whether each flip flop 720, in response to an edge of the clock signal, outputs data via its functional data output ($D_o$) or via its scan output ($S_o$). The test co-ordinator 610 asserts the scan enable signal to cause the flip flops 720 to output data via their scan data output. The test co-ordinator 610 asserts the scan enable signal when the test pattern provider 620 provides the test data. In this way, the test data is stored in the flip flops 720 without passing through the functional logic 710.

Once the test data is loaded into the flip flops 720, the test co-ordinator 610 deasserts the scan test enable signal. The test data held in the flip flops 720 is then clocked through the functional logic 710 for a predefined number of capture cycles. The predetermined number of capture cycles is often only one capture cycle. The functional logic 710 performs operations on the bits of the test data to modify the values of at least some of these bits. Each value of the test data is retrieved from flip flop 720 into which is loaded initially, and provided to a piece of functional logic 710. Each functional logic 710 performs one or more operations on the respective loaded bit of data, following which the result of the one or more operations is provided to the next flip flop 720 in the scan chain 700. After the predefined number of clock cycles, a response vector is held in the flip flops 720 of the scan chain 700. Each bit of the response vector is the product of processing by one or more blocks of the functional logic 710.

After the response vector is generated, the test co-ordinator 610 asserts a signal on the scan enable input. As a result, in response to the clock pulses of the clock signal, each flip flop 720 outputs its data value on its scan data output. In this way, the response vector is provided through the scan chain 700 and read out of the last flip flop 720 of the scan chain 700 and provided to the response compactor 640.

The response compactor 640 processes the response vector to produce data dependent upon the response vector, but having reduced data size compared to the response vector (i.e. the response compactor 640 generates a compacted response). The testing apparatus then compares the compacted response to the expected compacted response held in memory 650. If a match is found, the test passes. If a match is not found, the test fails.

Although in FIG. 7, all of the flip flops 720 shown are scan flip flops, which have an input for receiving test data to be applied to the functional logic 710, in some cases however, flip flops may be provided for storing functional data provided through the scan chain 700, which are not themselves scan flip flops.

According to embodiments, testing logic is provided on one of two die that are stacked together to form a 3D integrated circuit device. The 3D integrated circuit device may be the device 400 discussed above with reference to FIGS. 4, 5A, and 5B. The testing logic on one die is used to control the testing of logic circuitry on both of the die alternately. The testing logic on the one die is also used to control the testing of memory on both of the die alternately. In other words, the testing logic on one die is first used to test logic circuitry and/or memory on its own die, following which the testing apparatus is used to test logic circuitry and/or memory on the other die.

Figure 8:
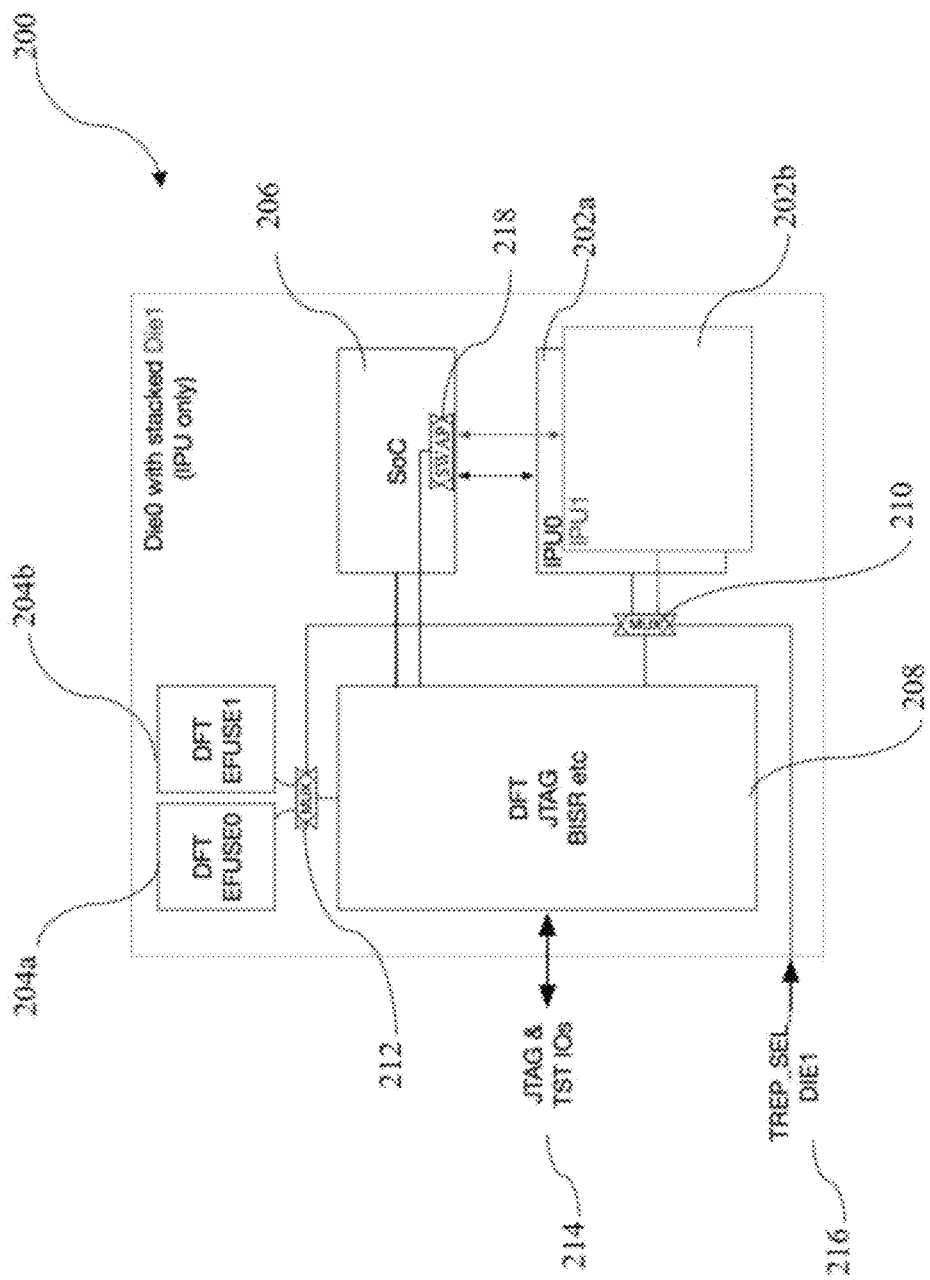
FIG. 8 is a schematic diagram of a stacked integrated circuit comprising testing logic for testing processing units of each of the die.

FIG. 8 is a schematic of the stacked device 400, which illustrates how testing logic 208 may be used for testing both of two logic die of the stacked device 400.

The first logic die 402a (labelled as Die0 in FIG. 8) comprises a processing unit 202a, system on chip components 206 (in addition to the processing unit 202a), testing and repair logic 208 and repair code storage 204a, 204b. The testing and repair logic 208 and the repair code storage 204a, 204b are both present on die0 902a. The testing and repair logic 208 is responsible for controlling the testing of the processing units 202a, 202b on both logic die of the device 400, for receiving and storing the repair code in storage 204a, 204b, and for supplying the repair code from storage 204a, 204b to the processing units 202a, 202b, so as to repair the logic and memory of processing units 202a, 202b. The repair code storages 204a, 204b (shown as eFuses 204a, 204b) store the repair codes for both of the processing units 202a, 202b. The repair code held in storage 204a is for repairing the processing unit 202a. The repair code held in storage 204b is for repairing the processing unit 202b.

The second logic die (labelled as Die1) comprises a processing unit 202b. For example, if the stacked device 400 is manufactured as set out above with respect to FIG. 8, both the first and second logic die 402b comprise similar circuitry, such that the second logic die 402b also comprises a copy of the testing and repair logic 208, eFuses 204a, 204b, and SoC 206. However, these components of the second logic die 402b need not be connected, because they are not required by the resultant computing device and because it would be difficult to provide TSVs for connecting these components. The second logic die 402b, therefore, makes use of the functionality provided by the testing and repair logic 208, eFuses 204a, 204b, and SoC 206 on the first logic die 402a.

The second logic die 402b uses the testing and repair logic 208 and eFuse 204b of the first logic die in the test and repair process. To provide a mechanism for this sharing of components, the first logic die 402a further comprises two-way multiplexer 210 and two-way multiplexer 212. The multiplexor 210 is used to select between the processing units 202a, 202b for interfacing with the testing and repair logic 208. When the multiplexor 210 is controlled so as to interface the processing unit 202a with the logic 208, the logic 208 supplies signals to control the testing of circuitry of the processing unit 202a. The logic 208 also stores repair code resulting from the testing of the processing unit 202a in the storage 204a and provides that repair code to the processing unit 202a for repairing faults detected during the testing.

Likewise, when the multiplexor 210 is controlled so as to interface the processing unit 202b with the logic 208, the logic 208 supplies signals to control the testing of circuitry of the processing unit 202b. The logic 208 also stores repair code resulting from the testing of the processing unit 202b in the storage 204b and provides that repair code to the processing unit 202b for repairing faults detected during the testing.

The multiplexor 212 is used to select between the storages 204a, 204b. A select signal 216 is provided to the multiplexers 210, 212 in order to select the appropriate processing unit 202a, 202b and eFuse 204a, 204b. The SoC 206 may comprise a swap multiplexer 218. The swap multiplexer 218 provides functionality required for the SoC 206 to control both processing units 202a, 202b simultaneously.

In order to test the stacked device 400, each processing unit 202a, 202b is tested in turn.

A first set of tests are run to test the first logic die 402a. The select signal 216 is set to low such that the processing unit 202a of the first logic die 402a and the eFuse 204a associated with the first logic die 402a are selected. In this way, processing unit 202a and eFuse 204a are accessible to the DFT logic 208. The DFT logic 208 causes test patterns to be passed through the scan chains of the processing unit 202a of the first logic die 402a to test said processing unit 202a. A comparison is performed (either on or off the device 400) to determine whether the outputs from the scan chains match the expected result. If not, a fault in the processing unit 202a is determined. Repair code determined in dependence upon the detected fault is stored in the storage 204a by the testing logic 208.

The first set of tests for the first logic die 402a may also comprise (e.g. using MBIST engines) performing tests for the memory of the processing unit 202a. This is described in more detail with respect to FIG. 9B.

The first set of tests may also comprise running test patterns associated with the SoC 206. These test patterns are passed from the test logic 208 through scan chains in the SoC 206. The output is compared to an expected output comprising a set of SoC test vectors which define the output which would be received if the SoC 206 were fully functional, and any faults identified. Generally, SoCs are not repairable, so no repair code is generated and instead a fault in the SoC 206 results in the stacked device 400 being discarded.

After the first set of tests has been run, and the repair code is stored to the selected eFuse 204a, the processing unit 202a and eFuse 204a are deselected and the processing unit 202b of the second logic die 402b and the eFuse 204b associated with the second logic die 402b are selected. Deselection may be achieved by selecting the other processing unit and eFuse, as described herein.

To achieve this deselection and selection, the select signal 216 is toggled to high such that the input/outputs of the processing unit and eFuse multiplexers 210, 212 are changed. The processing unit 202b and eFuse 204b associated with the second logic die 402b are now accessible to the DFT logic 208, while those associated with the first logic die 402a are not.

A second set of tests is then run. The logic 208 causes a set of test patterns (which may be the same or different to the test pattern used for the first set of tests) to be passed though the scan chains of the processing unit 202b of the second logic die 402b. A comparison is performed (either on or off the device 400) to determine whether the outputs from the scan chains match the expected result. If not, a fault in the processing unit 202b is determined. Repair code determined in dependence upon any detected faults is stored in the storage 204b.

The second set of tests may also comprise controlling circuitry (e.g. MBIST engines) to perform tests for the memories of the processing unit 202b. This is described in more detail later with respect to FIG. 9B.

Following the test and repair of both the first and second logic die 402a, 402b, that is after both the first and second set tests have been run and the repair codes stored to the respective eFuse 204a, 204b, the stacked device 400 is booted. The boot process is orchestrated by an external processor (referred to herein as the ICU), which manages reset and power supplies.

Booting involves resetting the stacked device 400 and reading, from the eFuse 204a associated with the first logic die 402a, the repair code for the processing unit 202a of the first logic die 402a and loading it in the processing unit 202a, followed by reading, from the eFuse 204b associated with the second logic die 402b, the repair code for the processing unit 202b of the second logic die 402b and loading it in the processing unit 202b. The logic 208 performs these operations of reading the repair code from the eFuses 204a, 204b and loading the repair code to the processing units 202a, 202b.

In some embodiments, the ICU may be responsible for supplying the select signal 216 and the input select signal 222. This may be the case in, for example, a commissioned part. In other embodiments, these select signals 216, 222 are supplied by the test controller, for example if a production tester is used.

Figure 9A:
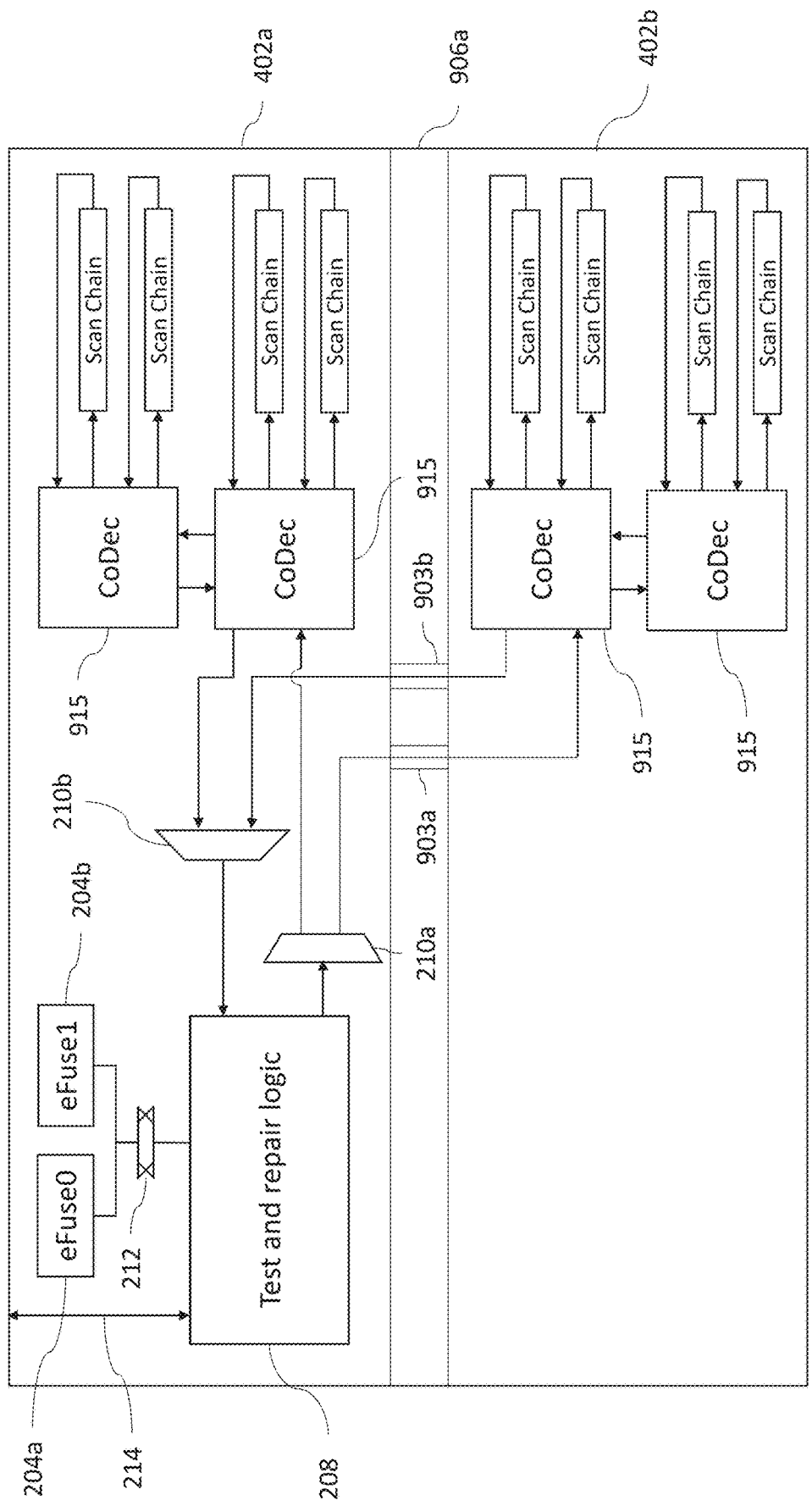
FIG. 9A illustrates the testing infrastructure in the stacked integrated circuit device for performing scan chain testing of the functional logic on both of the die.

Reference is made to FIG. 9A, which illustrates an example of the scan chain testing of the two die 402a, 402b. The test and repair logic 208 is shown as being part of the die 402a.

Each of the die 402a, 402b comprises one or more scan chains for testing functional logic in the manner described with respect to FIG. 7. FIG. 9A shows four example scan chains that are part of die 402a, and four example scan chains being part of die 402b. In embodiments, each of the die 402a, 402b may comprise an identical set of scan chains for testing identical logic of processing units 2 on the two die 402a, 402b. Each die 402a, 402b comprises thousands of scan chains for testing the logic of the respective die 402a, 402b. Each of the scan chains comprise a series of flip flops 720 and functional logic 710 as illustrated with respect to FIG. 7.

Each of the scan chains is connected to a control circuit 915 for supplying the test vectors to its associated scan chains and for receiving the response vectors output by its associated scan chains. The control circuit 915 is referred to herein as a CoDec (compressor-decompressor). Each of the CoDecs 915 is associated with a plurality of scan chains for which it is configured to supply test vectors and receive responses. Each of the CoDecs 915 on both die 402a, 402b operates under the control of the test logic 208 on die 402a. Each of the CoDecs 915 comprises processing circuitry for performing the operations described herein as being performed by the respective CoDec 915.

The testing logic 208 may provide the test vectors for at least some of the CoDecs 915, such that those CoDecs 915 provide the test vectors received from the testing logic 208 to one or more of their associated scan chains. In this case, the testing logic 208 itself receives those test vectors via the input connection 214 from a source (i.e. a test controller) external to the device.

The testing logic 208 may for at least some of the CoDecs 915, instead of providing the test vectors directly, provide control information enabling the CoDecs 915 themselves to determine the test vectors to be provided to the scan chains. For example, the testing logic 208 may provide a seed for a random number generator implemented in a CoDec 915. Each CoDec 915 that receives such a seed uses the seed to generate one or more test vectors to be applied to the scan chains.

In some embodiments, at least some of the CoDecs 915, when they receive the response vectors output by their associated scan chains, may themselves perform the comparisons between the response vector and an expected response vector. In this case, the CoDecs 915 implement the expected response memory 650 shown in FIG. 6. The CoDecs 915 determine the repair codes from the comparison between the response vector and the expected response vector and provides these repair codes to the testing logic 208, which stores them in storage 204a, 204b.

In some embodiments, at least some of the CoDecs 915 may, following receipt of the response vectors from their scan chains, compact the response (by functioning as response compactor 640 shown in FIG. 6) and provide the compacted response to the testing logic 208. The testing logic 208 provides the compacted response off chip over the connection 214 to a test controller (not shown in FIG. 9A). The test controller performs the comparison to determine if the response from the scan chain is as expected. The testing logic 208 receives from the test controller, the repair codes resulting from the testing and stores these in storages 204a, 204b.

As shown in FIG. 9A, one or more CoDecs 915 are connected to the testing logic 208 via connections through other CoDecs 915. The testing logic 208 has one or more serial links to the CoDecs 915 on die 402a and one or more serial links to the CoDecs 915 on die 402b, where each serial link may carry control information and receive responses from a plurality of the CoDecs 915. Therefore, the logic 208 is configured to provide any control information, such as test vectors, and receive any response, such as response vectors or repair codes from some CoDecs 915 via connections passing through other CoDecs 915.

The two way multiplexer 210 shown in FIG. 8, is represented in FIG. 9A by an output multiplexer 210a via which the testing logic 208 may send information to the CoDecs 915 and an input multiplexer 210b via which the testing logic 208 may receive information from the CoDecs 915. Each of these multiplexers 210a, 210b may be controlled via control signals received from the test controller (or from another external processor, e.g. the ICU) located external to the device 400.

In order to test functional logic 710 on die 402a, the output of multiplexer 210a to the CoDecs 915 on die 402a is selected. Control information (e.g. test vectors or seeds for generating test vectors) is provided to the CoDecs 915 on die 402a. This control information causes those CoDecs 915 to provide test vectors to the flip flops of their associated scan chains in the manner described with respect to FIG. 7. When performing the testing, the input of multiplexer 210b for receiving data from the CoDecs 915 on die 402a is also selected. Result information (e.g. a compacted response or repair code) resulting from the testing of the functional logic via the scan chains is provided from the CoDecs on die 402a to the testing logic 208. The testing logic 208 obtains the repair codes (either from the CoDecs 915 or from the test controller) and stores these in the eFuse 204a associated with die 402a.

In order to test functional logic 710 on die 402b, the output of multiplexer 210a to the CoDecs 915 on die 402b is selected. Control information (e.g. test vectors or seeds for generating test vectors) is provided to the CoDecs 915 on die 402b via the TSVs 903a. This control information causes those CoDecs 915 to provide test vectors to the flip flops of their associated scan chains in the manner described with respect to FIG. 7. When performing the testing, the input of multiplexer 210b from the CoDecs 915 on die 402b is selected. Result information (e.g. a compacted response or repair code) resulting from the testing of the functional logic via the scan chains is provided from the CoDecs on die 402b via the TSVs 903b to the testing logic 208. The testing logic 208 obtains the repair codes (either from the CoDecs 915 directly or from the off-chip test controller) and stores these in the eFuse 204b associated with die 402b.

It has been described that the functional logic on die 402a is tested first with the testing of the functional logic on die 402b taking place subsequently. However, in other embodiments, the order may be reversed, with the functional logic on die 402b being first tested, followed by the functional logic on die 402a.

Figure 9B:
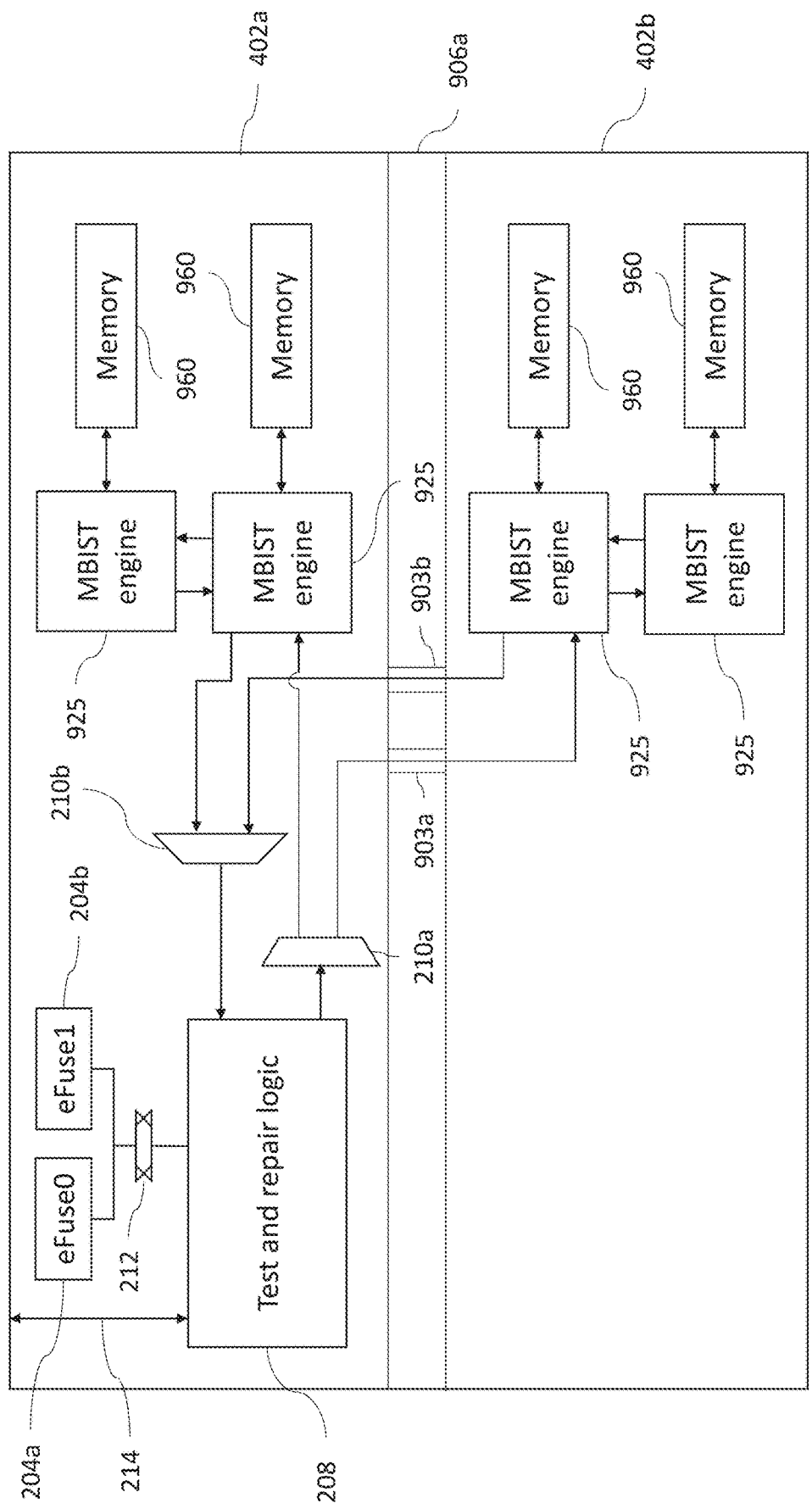
FIG. 9B illustrates the testing infrastructure in the stacked integrated circuit device for performing testing of the memories of both of the die.

Reference is made to FIG. 9B, which illustrates how the memories 960 on the two die 402a, 402b may be tested. A plurality of circuits 925 (labelled as MBIST engines 925) are provided in each of the die 402a, 402b. Each of the MBIST engines 925 is associated with a unit of memory 960. In embodiments, each such memory unit 960 is a row of memory macros of a larger memory bank. Each memory bank may be a memory of a tile 4 of a processing unit 2.

The testing logic 208 provides control signals to the MBIST engines 925 to cause these engines 925 to perform the testing of their associated memories 960. Each MBIST engine 925, in response to such a control signal from the testing logic 208, addresses its associated memory 960 using test patterns that it has generated. Each MBIST engine 925 additionally determines the expected response from the testing of its associated memory 960 and compares this expected response to the response resulting from the testing of the associated memory 960. Each MBIST engine 925 determines from the comparison operation, a repair code for its associated memory 960 and provides this repair code to the testing logic 208 for storing in the appropriate repair code storage 204a, 204b.

In order to test the memories 960 on die 402a, the output of multiplexer 210a to the MBIST engines 925 on die 402a is selected. Control information is provided to the memories 960 on die 402a from logic 208. This control information causes those MBIST engines 925 to apply test data to their associated memory 960. When performing the testing, the input of multiplexer 210b for receiving data from the MBIST engines 925 on die 402a is also selected. Repair codes resulting from the testing of the memories 960 are provided from the MBIST engines 925 on die 402a to the testing logic 208. The testing logic 208 obtains the repair codes and stores these in the eFuse 204a associated with die 402a. The testing logic 208 may store the repair codes in the eFuse 204a in compressed form.

In order to test the memories 960 on die 402b, the output of multiplexer 210b to the MBIST engines 925 on die 402b is selected. Control information is provided from the logic 208 via the TSVs 903a to the memories 960 on die 402b. This control information causes each of those MBIST engines 925 to apply test data to their associated memory 960. When performing the testing, the input of multiplexer 210b for receiving data from the MBIST engines 925 on die 402b is also selected. Repair codes resulting from the testing of the memories 960 is provided from the MBIST engines 925 on die 402b to the testing logic 208.

The testing logic 208 obtains the repair codes stores these in the eFuse 204b associated with die 402b. The testing logic 208 may store the repair codes in the eFuse 204b in compressed form. The CoDecs 915 and MBIST 925 constitute testing apparatus that operates under the control of testing logic 208.

It has been described that a multiplexer 210a is used to select between the two die 402a, 402b for providing control signals and/or test data. In embodiments, there may be multiple such multiplexers 210a that are controlled together to select between providing control signals and/or test data received on multiple wires to the first logic die 402a or the second logic die 402b. Similarly, it has been described that a multiplexer 210b is used to select between the two die 402a, 402b for receiving responses and/or repair codes. In embodiments, there may be multiple such multiplexers 210b that are controlled together to select between receiving responses and/or repair codes from the first logic die 402a or the second logic die 402b for output on multiple wires to the logic 208.

In some embodiments, a scan chain on one of the die may also be used to test the connections between the two die 402a, 402b. The same scan chain may be used for the dual purpose of testing the connections between the die 402a, 402b in addition to testing a path though functional logic on one of the die 402a, 402. This can be achieved by use of an external loopback mode, in which a functional path between two flip flops in the scan chain on one die passes along a looped path to the other die and back. As a result a bit of test data stored in a flip flop in a scan chain on one die is sent (during a capture cycle) along then looped connection to the other die and back and then stored in another flip flop of the scan chain. This functional path between the two flip flops includes connections between the two die and also includes functional logic, which is also tested. Any fault that occurs, may be a fault with this logic on the path or may be a fault with the connections between the die 402a, 402b.

If a fault is detected from the testing performed in the external loopback mode, additional testing may be performed in an internal loopback mode in order to isolate the fault. During the internal loopback mode, the same test pattern is provided to the scan chain and provided (during a capture cycle) along a different connection between the two flip flops, where that connection passes through the same functional logic, but not through the connections to the other die. A comparison is performed between the results obtained using internal loopback mode vs external loopback mode. If the result achieved when applying the internal loopback mode matches the result achieved when applying the external loopback mode, then it is determined that there are no faults associated with the connections.

Figure 10A:
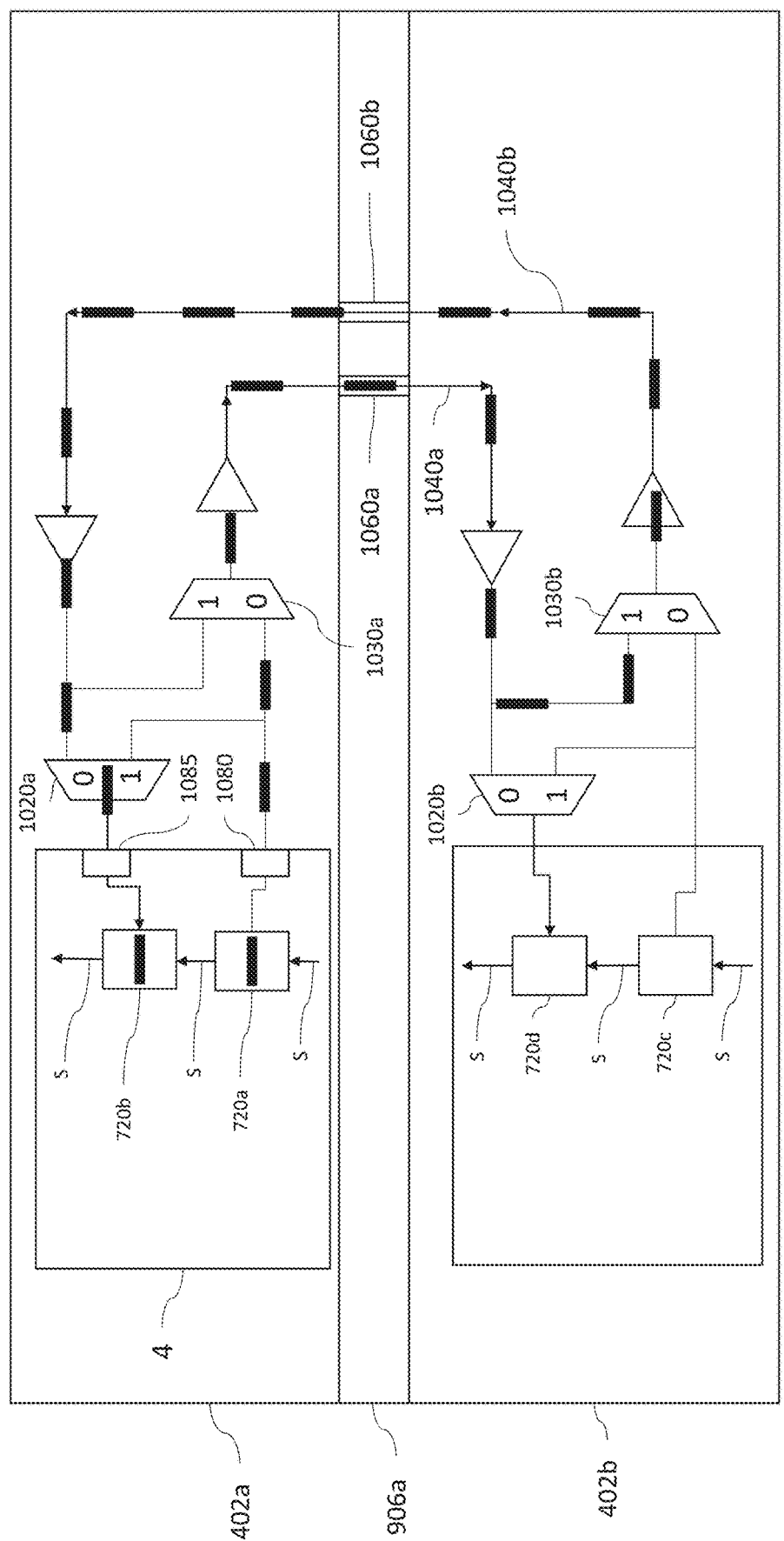
FIG. 10A illustrates scan chain testing performed in an external loopback mode.

Reference is made to FIG. 10A, which illustrates an example of the movement of bit of test data between two flip flops when external loopback mode is applied. Two flip flops 720a, 720b of the first logic die 402a are shown in FIG. 10A. These flips flops 720a, 720b comprise part of a scan chain into which a test vector is stored by a Codec on die 402a. The scan chain is part of a tile 4 on the die 402a. The scan chain may also comprise additional flop flips (not shown in FIGS. 10A and 10B0 that are used in the same way as flip flops 720a, 720b for testing other connections between the die 402a, 402b and other interfaces of the tile 4. The data paths via which bits of the test vector are read into each of the flip flops 720a, 720b are shown as being indicated by the letter 'S'. The path via which a bit of test data is output from a functional data output of the flip flop 720a to a flip flop 720b during a capture cycle is indicated via the bold lines shown in FIG. 10A.

A plurality of multiplexers 1020a, 1020b, 1030a, 1030b are shown in FIG. 10A. These multiplexers 1020a, 1020b, 1030a, 1030b control whether or not a test is performed in internal loopback mode or external loopback mode. If a first input (labelled '0') is selected, the associated scan chain is held in external loopback mode. If a second input (labelled '1') is selected, the associated scan chain is held in internal loopback mode. The multiplexers 1020a, 1020b, 1030a, 1030b are controlled via signals from the testing logic 208, which determines whether external or internal loopback mode is applied for a particular test using this scan chain.

FIG. 10A shows a path of data (illustrated by the thick lines shown) when a test is run in external loopback mode. During the capture cycle, a single bit of data is output from the flip flop 720a and provided to the flip flop 720b. As shown, as a result of the selection of the relevant inputs of the multiplexers 1020a, 1020b, 1030a, 1030b such that external loopback mode is applied, the bit of test data passes from flip flop 720a through logic 1080 of the tile interface and over connection 1060a to the other die 402b. The second input (i.e. "1") of multiplexer 1020b is selected such that the test data does not pass into the tile 4 shown n FIG. 10A as belong to die 402b. The second input (i.e. "1") of multiplexer 1030b is selected, such that the test data is routed along wire 1040b and through TSV 1060b back to the die 402a. The bit of data passes though logic 1085 on the tile interface to reach flip flop 720b, where it is stored. Only a single clock cycle is required for the data to pass from one flip flop 720 on die 402a, along the wires 1040a connecting to the other die 402b, and back along the wire 1040 from the die 4022 to arrive at the next flip flop 720b in the scan chain on die 402a.

After a single capture cycle, the test vector is read out of the scan chain and the result stored. The bit of data read out from flip flop 720b indicates the result when external loopback mode is applied. This is compared (e.g. in the relevant Codec, in the test logic 208, or in an off-chip test controller 1430) to an expected result to determine whether any fault is detected.

Since the bit read out from the flip flop 720b will indicate the result of a test with a particular test bit value (e.g. 0) stored in flip flop 720a, the test may be rerun in external loopback mode, but with an alternative test bit value (e.g. 1) held flip flop 720a. The results for both of these tests is compared to the expected result and, if the result for either test fails to match the expected result, then a fault is detected.

If a fault is detected when testing in external loopback mode, further testing may be performed using internal loopback mode to attempt to isolate the fault to either the connections 1060a, 1060b or to the functional logic 1080, 1085 on the tile interface.

Figure 10B:
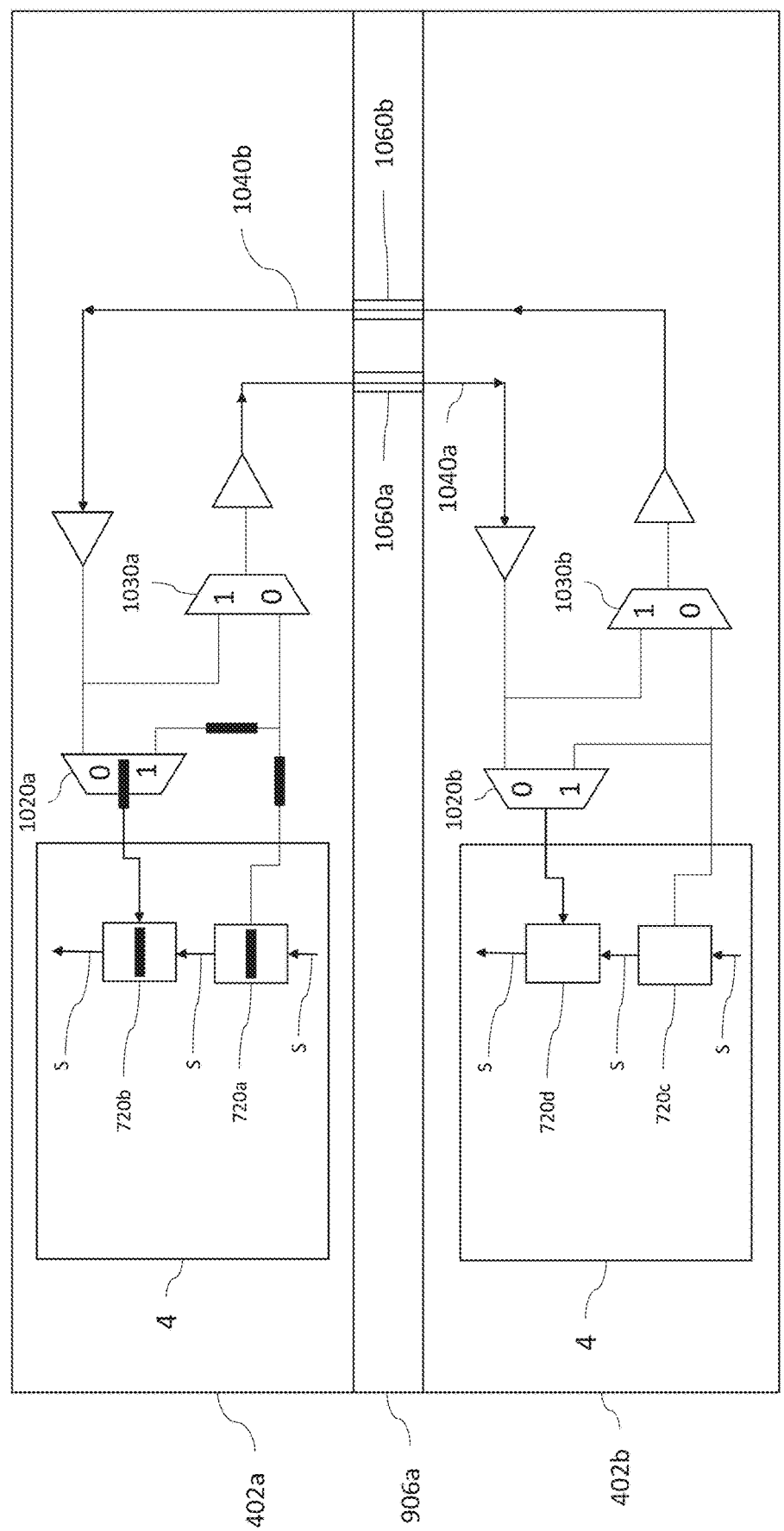
FIG. 10B illustrates scan chain testing performed in an internal loopback mode.

FIG. 10B shows a path of data (illustrated by the thick lines shown) when a test is run in internal loopback mode. As in external loopback mode, a test vector is loaded into the scan chain comprising flip flops 720a, 720b. A capture cycle is applied in which a bit of the test vector held in flip flop 720a is provided to the flip flop 720b. In the internal loopback mode, the second input (i.e. 1) of the multiplexer 1030a is selected such that the data bit does not pass through the connection 1060a to the other die 402b. The second input (i.e. 1) of the multiplexer 1020a is selected such that the data bit passes to the flip flop 720b via an alternative, shorter path to that traversed when in external loopback mode.

Since the bit read out from the flip flop 720b will indicate the result of a test with a particular test bit value (e.g. 0) held in flip flop 720a, the test may be rerun in internal loopback mode, but with an alternative test bit value (e.g. 1) held flip flop 720a and provided to flip flop 720b during a capture cycle. The results for both of these tests is compared to the expected result and, if the result for either test fails to match the expected result, then a fault is detected.

Since only a single clock cycle is required for the data to loopback from the die 402b, providing the connections 1060a, 1060b are functioning appropriately (i.e. there are no faults with the connections 1060a, 1060b), the response to the test that is produced when operating in external loopback mode will be the same as the response to the test that is produced when operating in internal loopback mode.

The path from flip flop 720a to flip flop 720b when operating in the internal loopback mode still passes through logic 1080, 1085 of the tile interface. Hence, any errors in the logic of the tile interface will be identifiable in the results of the test performed in internal loopback mode. If a fault that is detected from the tests in external loopback mode, is not detected when applying internal loopback mode, then it is determined that the fault is associated with at least one of the connections 1060a, 1060b between the two die 402a, 402b. However, if the fault is detected when operating in both external loopback and internal loopback mode, then the fault is likely to be associated with functional logic.

In order to confirm (to a high degree of certainty) whether the detected fault is due to functional logic on die 402a, a similar scan chain test may be run using the equivalent flip flops 720c, 720d on die 402b in external loopback mode. In this case, a bit of test data is provided during a capture cycle from flop 720c through connection 1060b to die 402a and back to die 402b over connection 1060a for delivery to flip flop 720d. In this case, the multiplexers 1020b, 1030b are controlled by the test logic 208 to select their first input (i.e. "0"), and the multiplexers 1020a, 1030a are controlled by test logic 208 to select their second input (i.e. "1"). When the response is read out of the scan chain comprising flip flops 720c, 720d, if no error is detected in the bit read from flip flop 720d (i.e. the bit matches the expected value), then it is determined that there is no error with the connections 1060a, 1060b.

When performing the testing described with respect to FIGS. 10A and 10B, the testing logic 208 provides the control signals to co-ordinate the testing. The testing logic 208 provides the control signals to each of the multiplexers 1020a, 1030a, 1020b, 1030b to determine whether external or internal loopback mode is enabled for a test to be run. Furthermore, the testing logic 208 causes the CoDecs 915a, 915b to provide the test vectors to the scan chains comprising the flip flops 720a, 720b thorough the relevant scan chains so as to perform the testing in internal or external loopback mode.

The paths shown in FIGS. 10A and 10B may be wires 1040a, 1040b that connect the output port of one tile 4 on one of the die 402a, 402b to the input port of another tile 4 on the other of the die 402a, 402b. Each of the tiles 4 comprises over one hundred scan chains for testing the logic in the tiles 4.

As has been described, storage 204a, 204b in the first die 402a is used for the storing of repair code for repairing the processing units 202a, 202b on both of the die 402a, 402b. This repair code may be code that causes faulty tiles 4 in the processing units 202a, 202b to be disabled. An example of such repair code is described in our earlier U.S. application Ser. No. 16/395,363, which is incorporated by reference.

It has been noted that, in some embodiments, the two stacked die may be identical or at least very similar. In this case, a challenge may arise as to how the build connections between two different set of functional logic on identical die. Different methods may be employed in order to connect the two sets of functional logic 1010a, 1010b in the case that the die 402a, 402b are identical. Each one of the functional logic 1010a, 1010b may be a tile 4.

Figure 11:
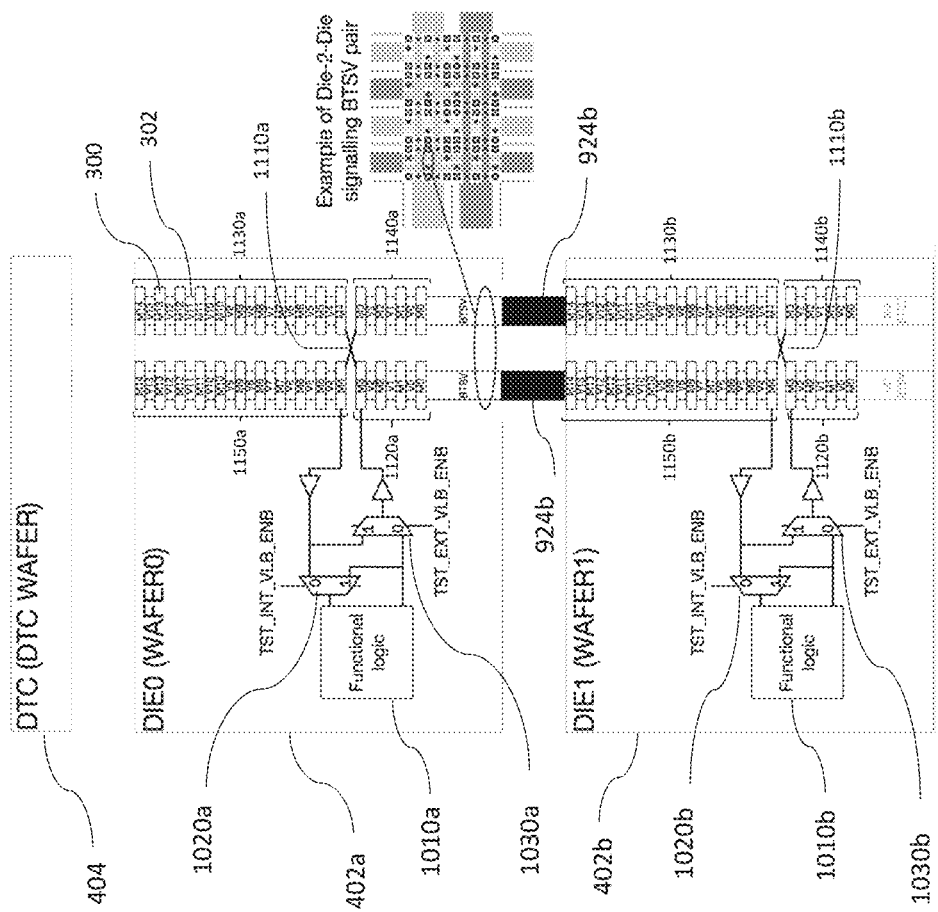
FIG. 11 illustrates the connections formed between the die using a cross-over IOs approach.

Reference is made to FIG. 11, which illustrates the connections between the functional logic 1010a, 1010b according to an example embodiment. Each of the functional logic 1010a, 1010b is connected to two connecting wires, which are represented by the plurality of metal 300 and via 302 layers through which those wires are formed. Each pair of wires cross over one another at cross over points 1110a, 1110b.

Functional logic 1010a is connected to a first wire, which comprises a first section 1120a formed between M0 to M3 metal layers and a second section 1130a formed between M4 to M14 metal layers. Since the first logic die 402a is stacked above the second logic die 402b, the first section 1120a is used for sending signals to functional logic 1010b on die 402b through a BTSV, whilst the second section 1130a is unconnected to logic above the die 402a. Functional logic 1010a is also connected to a second wire, which comprises a first section 1140a formed between M0 to M3 metal layers and a second section 1150a formed between M4 to M14 metal layers. Since the die 402a is stacked above the second logic die 402b, the first section 1140a is used for receiving signals from functional logic 1010b on die 402b through a BTSV, whilst the second section 1150a is unconnected to logic above the die 402a.

Functional logic 1010b is connected to a first wire, which comprises a first section 1120b formed between M0 to M3 metal layers and a second section 1130b formed between M4 to M14 metal layers. This first wire of die 402b corresponds to the first wire of 402a, discussed above. However, since the die 402b is stacked as the bottom of the two die 402a, 402b, the second section 1130b is used to transmit signals to functional logic 1010a, with the first section 1120b being unconnected to logic below the die 402b. Functional logic 1010b is also connected to a second wire, which comprises a first section 1140b formed between M0 to M3 metal layers and a second section 1150b formed between M4 to M14 metal layers. This second wire of die 402b corresponds to the second wire of 402a, discussed above. However, since the die 402b is stacked as the bottom of the two die 402a, 402b, the second section 1150b is used to receive signals from functional logic 1010a, with the first section 1140b being unconnected to logic below the die 402b.

In this using the cross-over wires—or cross over IOs—the die 402a, 402b having a same arrangement of wires may be provided together in a stacked device 400.

In another embodiment, rather than having two crossed-over connecting wires, each functional logic 1010a, 1010b is connected to four separate wires, two of them designed to be connected to a die attached above the die of the respective functional logic 1010a, 1010b, and two designed to be connected to a die below the die of the respective functional logic 1010a, 1010b. The multiplexers 1020a, 1030a, 1020b, 1030b in this embodiment are three-way multiplexers which, in addition to being used to select between internal and external loopback mode, are also used to select between two different input wires for their associated functional logic 1010a, 1010b.

Figure 12:
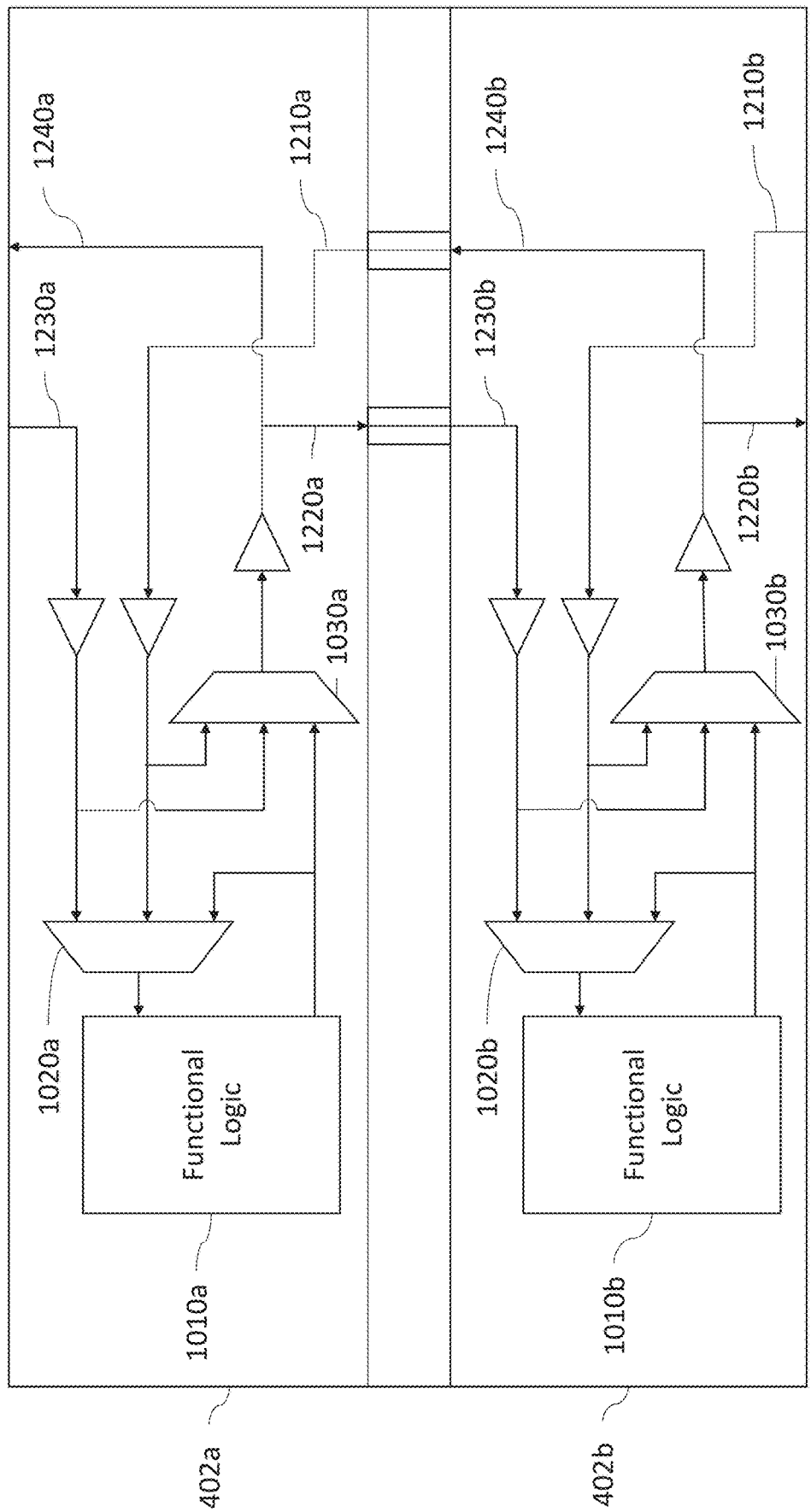
FIG. 12 illustrates the connections formed between the die using multiplexers to select paths in dependence upon the die identity.

Reference is made to FIG. 12, which illustrates an example of the embodiment in which each functional logic 1010a, 1010b is connected to four separate wires.

Functional logic 1010a has a first wire 1210a for receiving signals from a die beneath die 402a (in this case die 402b), and a second wire 1220a for sending signals to a die beneath die 402a (in this case die 402b). Functional logic 1010a also has a third wire 1230a for receiving signals from a die above die 402a and a fourth wire 1240a for sending signals to a die above die 402a. In this case, since die 402a is the top die of the two die 402a, 402b, the third and fourth wires 1230a, 1240a are unused. The multiplexer 1020a is controlled (in part) by a signal identifying the die 402a as the top/first die of the two die 402a, 402b, so as to select the first wire 1210a (instead of the third wire 1230a) for receiving signals.

Functional logic 1010b has a first wire 1210b for receiving signals from a die beneath die 402b, and a second wire 1220b for sending signals to a die beneath die 402b. In this case, since die 402b is the bottom/second die of the two die 402a, 402b, the first and second wires 1210b, 1220b are unused. Functional logic 1010b also has a third wire 1230b for receiving signals from a die above die 402b (in this case die 402a) and a fourth wire 1240b for sending signals to a die above die 402b (in this case die 402a). In this case, since die 402b is the bottom/second die of the two die 402a, 402b, the third and fourth wires 1230a, 1240a are both used. The multiplexer 1020b is controlled (in part) by a signal identifying the die 402b as the bottom/second die of the two die 402a, 402b, so as to select the third wire 1230b (instead of the first wire 1210b) for receiving signals.

Figure 13:
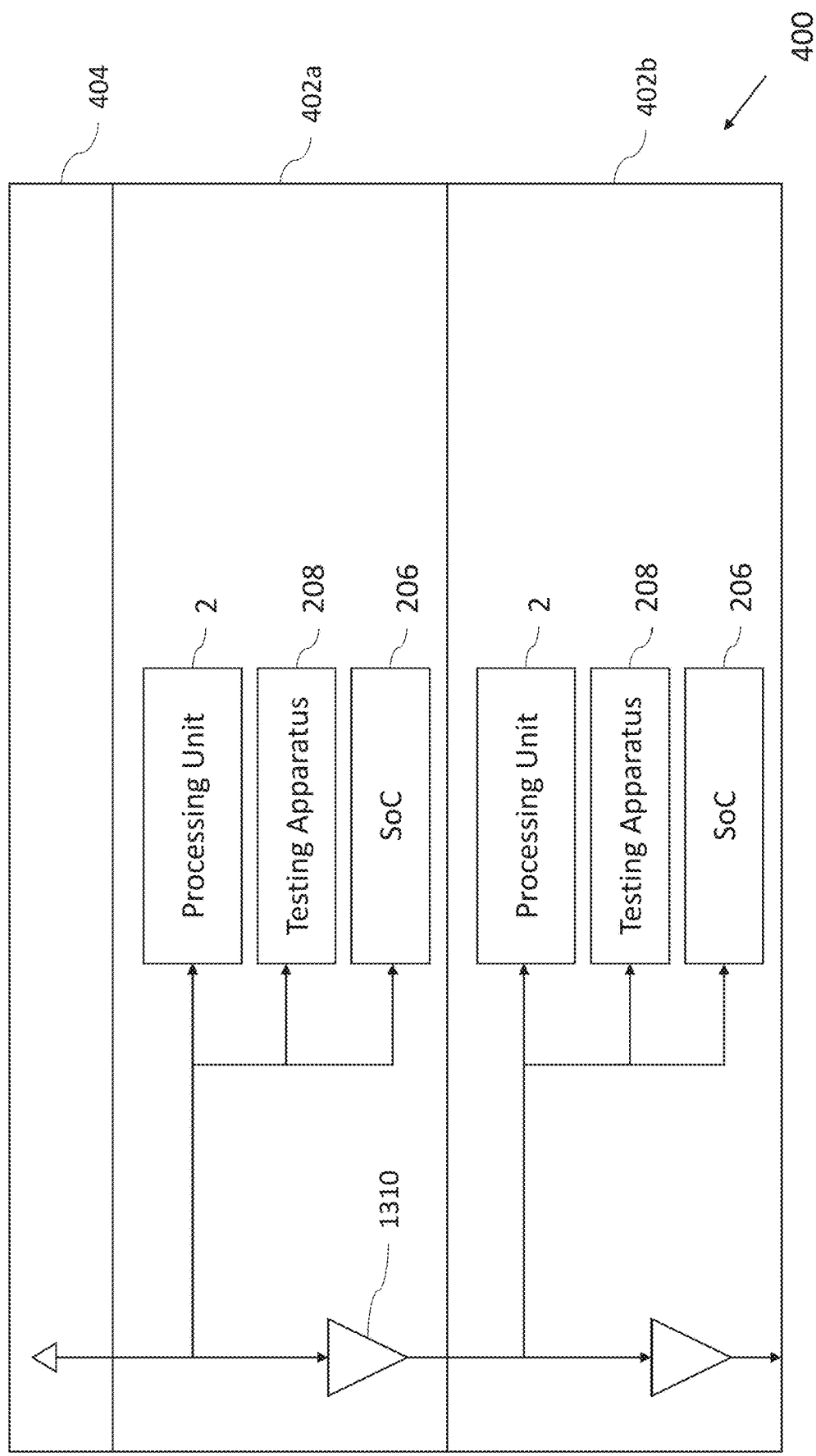
FIG. 13 illustrates the supply of a die ID signal to each of the die in the stacked integrated circuit device.

Reference is made to FIG. 13, which illustrates an example of how the signal identifying each of the die 402a, 402b may be distributed to the circuitry of the respective die 402a, 402b. The signal is produced on the top die 404. In the example in FIG. 13, this signal is held to ground. This signal constitutes a signal identifying the first die 402a and is provided to a plurality of different components (including the processing unit 2, testing logic 208 and additional SoC components 206) of the first die 402a. In response to receipt of this signal, each of the components performs any operations described above as being performed specifically by the die 402a.

The first die 402a comprises an invertor 1310 that is configured to invert the signal received from the die 404 so as to produce a signal identifying the second logic die 402b. This signal is provided on a connection to die 402b. At die 402b, the signal identifying die 402b is supplied to each of a plurality of components (including the processing unit 2, testing logic 208 and additional SoC components 206) on die 402b. In response to receipt of this signal, each of the components performs any operations described above as being performed specifically by the die 402b.

It will be appreciated that, although the above example uses the SoC as an unrepairable element, the SoC may be designed to include redundancies and therefore can be repaired.

The above method for testing the processing units 202a, 202b of the stacked device 400 can be used for testing stacked device comprising other functional logic, provided the functional logic to be tested on the stacked device is identical. The logic to be tested is the logic which is usefully used when the stacked device is used. In the example set out above, the useful logic is the processing unit. This is the logic of both die which is powered and connected for signalling. However, the method set out above is not limited to testing processing units, and other such identical and used logic may be tested in the same way.

Figure 14:
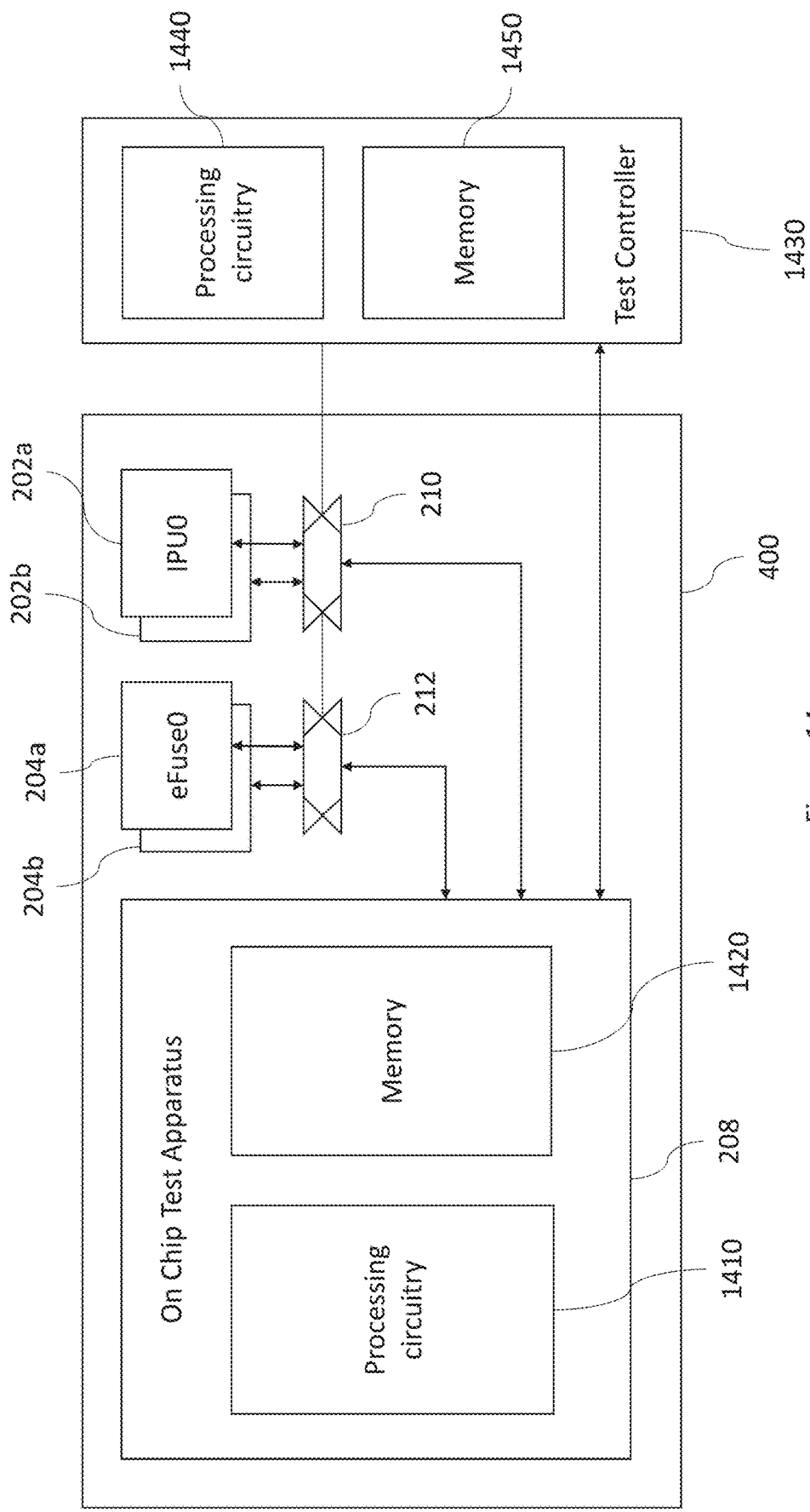
FIG. 14 is a schematic diagram of the testing infrastructure, including the off-chip test controller.

Reference is made to FIG. 14, which illustrates the stacked integrated circuit device 400 in combination with the test controller 1430. As described the stacked integrated circuit device 400 comprises the test logic 208, which is part of the first die 402a. The test logic 208 interfaces the CoDecs 915 and MBIST engines 925 with the test controller 1430. Together, the test logic 208, CoDecs 915 and MBIST engines 925 and the test controller 1430 form test infrastructure for the device 400.

In this example, the test controller 1430 provides the control signals for the multiplexers 210, 212, so as to control which of the die 402a, 402b is selected for communication with the logic 208 and to control which of the storages 204a, 204b is selected for storing or loading repair code. Alternatively, in some example embodiments, the multiplexers may operate under the control of an alternative external processor (e.g. an ICU).

The test controller 1430 comprises processing circuitry 1440 and memory for performing operations as described above as being performed by the test logic 208. The logic 208 comprises processing circuitry 1410 and memory 1420 for performing the operations described above as being performed by the test logic 208.

In some embodiments, circuitry 1410 and circuitry 1440 may each comprise a processor for executing computer readable instructions for performing the operations described above as being performed by the logic 208 or test controller 1430, respectively. Together, by executing these instructions, the test logic 208 and test controller 1430 may cause a method for testing the stacked integrated circuit device 400 to be performed.

Figure 15A:
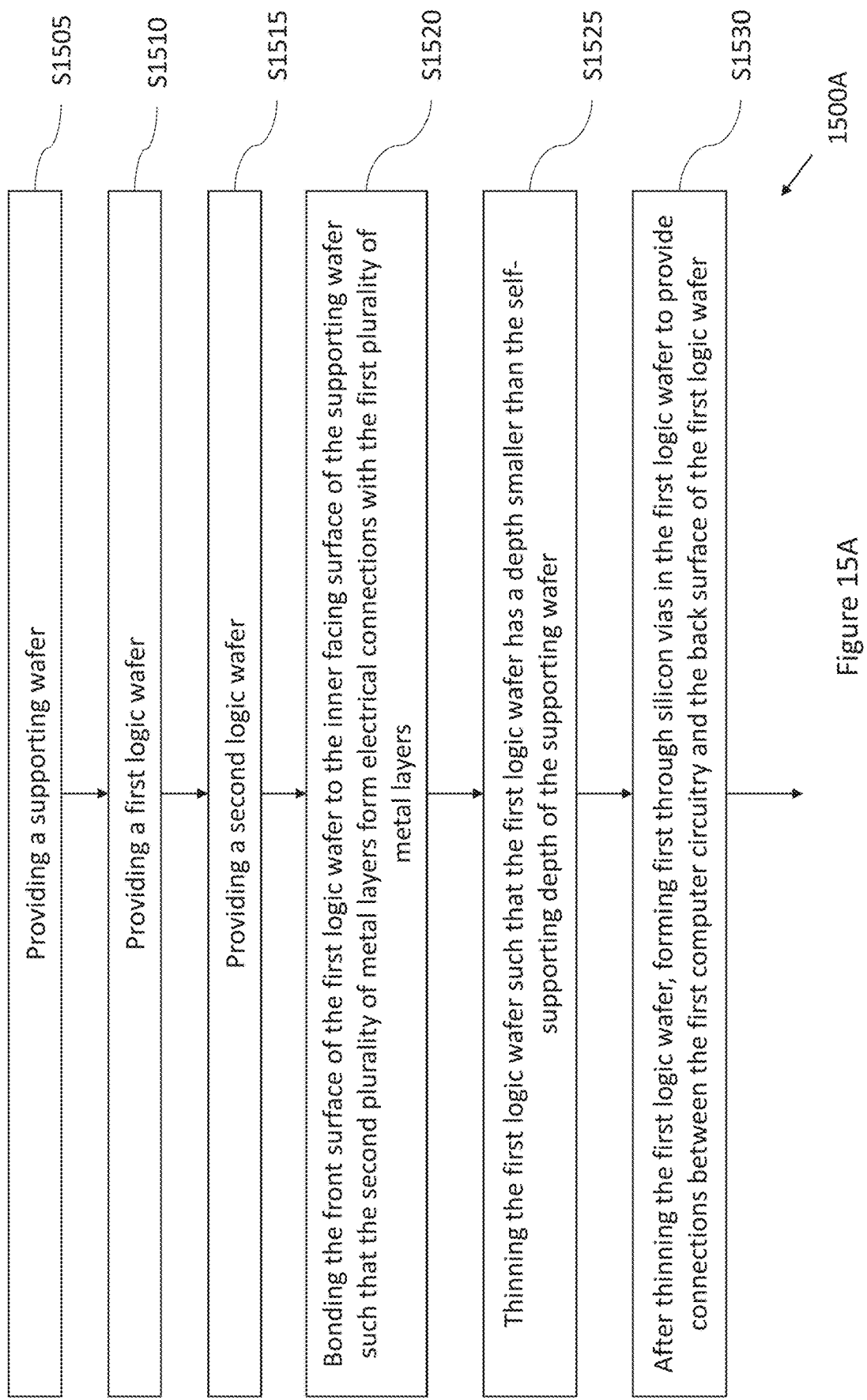
FIG. 15A shows a first part of a method of manufacture of the stacked integrated circuit device.
Figure 15B:
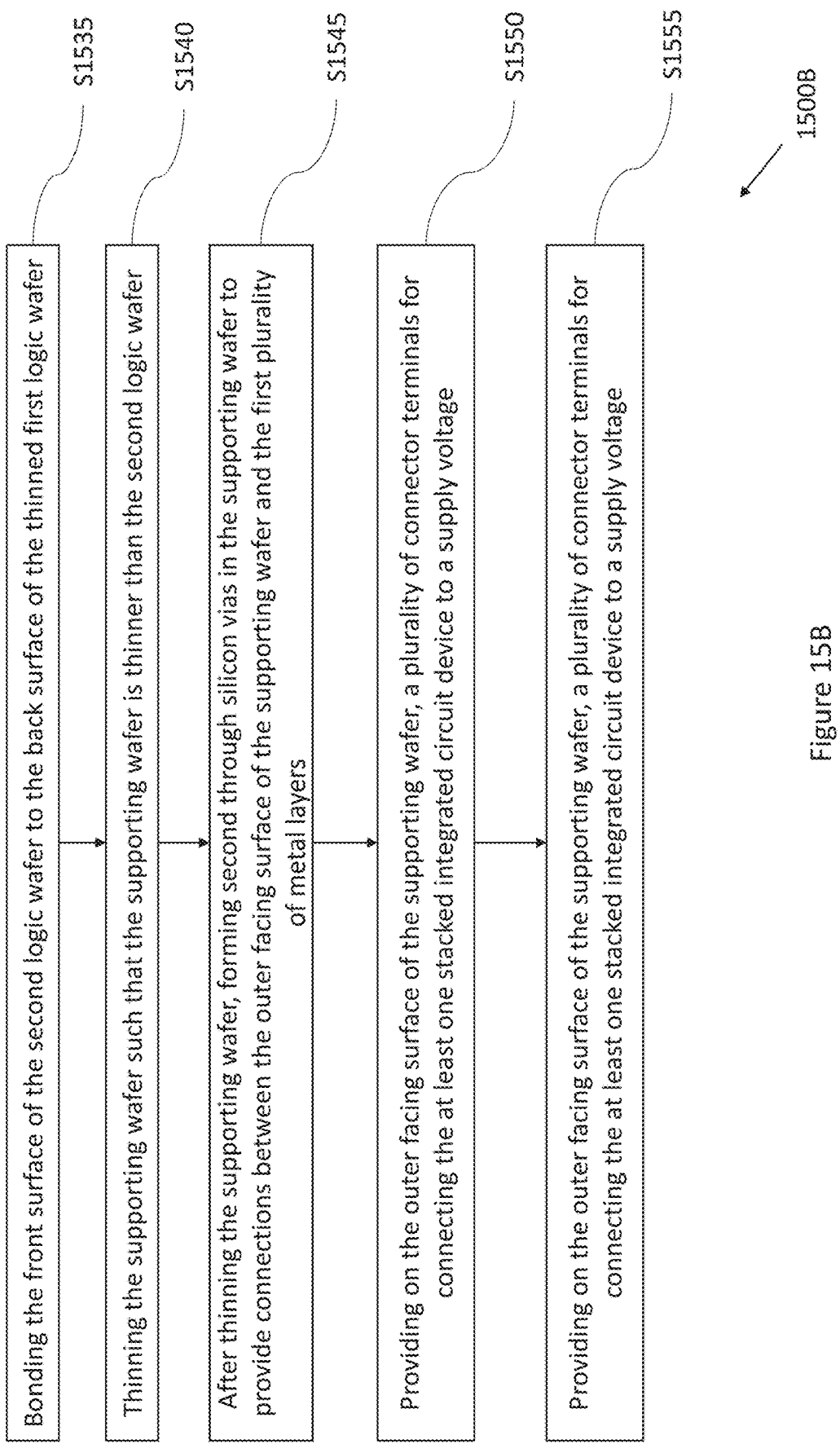
FIG. 15B shows a second part of a method of manufacture of the stacked integrated circuit device.

Reference is made to FIG. 15A, which illustrates a first part 1500A of a method for constructing a plurality of stacked integrated circuit devices.

At S1505, a supporting wafer comprising a silicon substrate and a first plurality of metal layers is provided. The first plurality of metal layers provides an inner facing surface of the supporting wafer. The silicon substrate provides an outer facing surface of the supporting wafer.

At S1510, a first logic wafer having a front surface and back surface is provided. The front surface is a surface of a second plurality of metal layers belonging to the first logic wafer. The second plurality of metal layers comprises first processing circuitry.

At S1515, a second logic wafer having a front surface and back surface is provided. The front surface is a surface of a third plurality of metal layers belonging to the second logic wafer. The third plurality of metal layers comprises second processing circuitry.

At S1520, the front surface of the first logic wafer is bonded to the inner facing surface of the supporting wafer, such that the second plurality of metal layers forms electrical connections with the first plurality of metal layers.

At S1525, the first logic wafer is thinned such that the first logic wafer has a depth smaller than the self-supporting depth of the supporting wafer.

At S1530, after thinning the first logic wafer, a first set of through silicon vias are formed in the first logic wafer so as to provide connections between the first processing circuitry and the back surface of the first logic wafer.

At S1535, the front surface of the second logic wafer is bonded to the back surface of the thinned first logic wafer.

At S1540, the supporting wafer is thinned such that the supporting wafer is thinner than the second logic wafer.

At S1545, after thinning the supporting wafer, a second set of through silicon vias are formed in the supporting wafer so as to provide connections between the outer facing surface of the supporting wafer and the first plurality of metal layers.

At S1550, a plurality of connector terminals are provided on the outer facing surface of the supporting wafer. These are provided for connecting the at least one stacked integrated circuit device to a supply voltage.

At S1555, the bonded wafer structure obtained by performing steps S1505 to S1550 is diced into a plurality of stacked integrated circuit devices.

Figure 16:
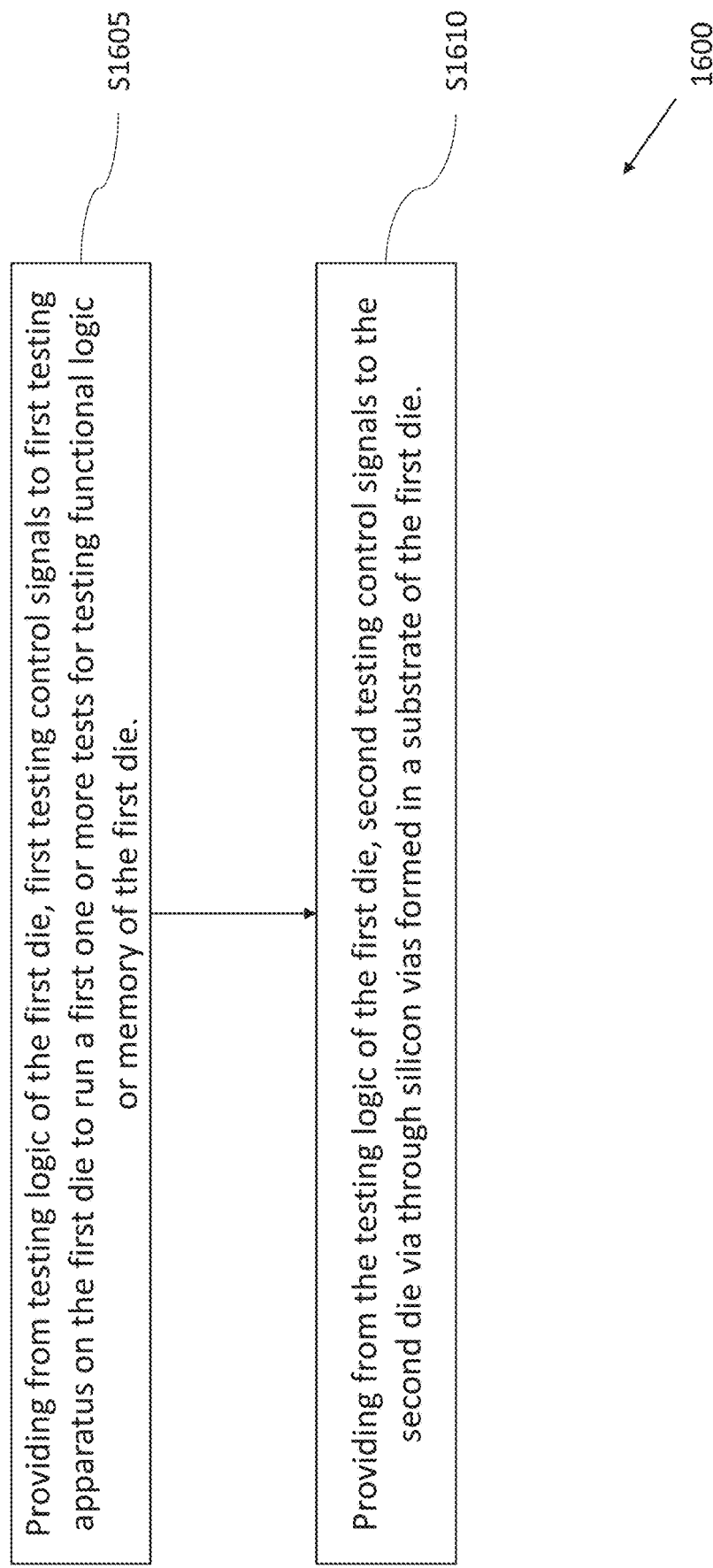
FIG. 16 shows a method for testing the stacked integrated circuit device.

Reference is made to FIG. 16, which illustrates a method 1600 for testing a logic and/or memory of a stacked integrated circuit device.

At S1605, first testing control signals are provided to first testing apparatus on the first logic die 402a so as to run a first one or more tests for testing functional logic or memory of the first die.

At S1610, second testing control signals are provided from the testing logic of the first die to the second die via through silicon vias formed in a substrate of the first die.

It would be appreciated that the above embodiments have been described by way of example only.

The invention claimed is:

1. A method for testing a stacked integrated circuit device comprising a first die and a second die, the method comprising:
   sending first testing control signals to first testing apparatus on the first die from testing logic of the first die;
   in response to the first testing control signals, the first testing apparatus running a first one or more tests for testing functional logic or memory of the first die;
   sending second testing control signals from the testing logic of the first die to the second die by first through silicon vias formed in a substrate of the first die; and
   in dependence upon the second testing control signals from the first die, running a second one or more tests for testing the stacked integrated circuit device.

2. The method of claim 1, wherein the method further comprises:
   determining from the first one or more tests, at least one first repair code for at least one of the functional logic or memory of the first die;
   storing in storage on the first die, the at least one first repair code;
   determining from the second one or more tests, at least one second repair code for at least one of functional logic or memory of the second die; and
   storing in the storage on the second die, the at least one second repair code.

3. The method of claim 2, wherein the at least one first repair code and the at least one second repair code are stored at least partially in compressed form.

4. The method of claim 2, wherein the storage comprises a first eFuse for storing the at least one first repair code and a second eFuse for storing the at least one second repair code.

5. The method of claim 2, wherein the method further comprises:
   sending the at least one second repair code from the testing logic of the first die to the second die by through second silicon vias formed in the substrate of the first die; and
   using the at least one second repair code to operate a processing unit on the second die with one or more parts of the processing unit being repaired in accordance with the at least one second repair code.

6. The method of claim 1, wherein the first testing apparatus comprises memory test circuitry of the first die, wherein the first testing control signals comprise signals configured to cause the memory test circuitry of the first die to apply first test patterns to the memory of the first die,
   wherein the second testing control signals comprise signals configured to cause memory test circuitry of the second die to apply second test patterns to the memory of the second die.

7. The method of claim 1, wherein the first one or more tests comprise scan chain tests.

8. The method of claim 7, wherein the method further comprises:
   testing connections between the first die and the second die by causing a first of the scan chain tests to be run such that test data is provided from a first flip flop in a first scan chain of the first die to a second flip flop in the first scan chain by a path that passes through the connections between the first die and the second die.

9. The method of claim 8, wherein the method further comprises:
   causing a second of the scan chain tests to be run such that test data is provided from the first flip flop in the first scan chain of the first die to the second flip flop by a further path that does not pass through the connections between the first die and the second die; and
   identifying any faults with the connections between the first die and the second die by comparing results of the first of the scan chains tests to results of the second of the scan chain tests.

10. The method of claim 9, wherein the method further comprises:
    providing from the first die, multiplexer control signals to multiplexers of the first die and the second die so as to select between the path or the further path when running the scan chain tests.

11. The method of claim 7,
    wherein the first testing control signals comprise first test vectors for input by the first testing apparatus on the first die to first scan chains on the first die for testing the functional logic of the first die,
    wherein the second testing control signals comprises second test vectors for input by second testing apparatus on the second die to second scan chains on the second die for testing the functional logic of the second die.

12. The method of claim 7, wherein the method further comprises:
    receiving, at the testing logic, results obtained from the scan chain tests; and
    the testing logic outputting the results to an off-chip testing controller.

13. The method of claim 7, wherein the method further comprises:
    wherein the first testing control signals comprise first information enabling the first testing apparatus to provide first test vectors to scan chains on the first die; and
    wherein the second testing control signals comprise second information enabling second testing apparatus on the second die to provide second test vectors to scan chains on the second die.

14. The method of claim 13, wherein the first information comprises a seed for a random number generator implemented in the first testing apparatus, wherein the second information comprises a seed for a random number generator implemented in the second testing apparatus.

15. The method of claim 1, wherein the method comprises:
the testing logic receiving by an interface of the stacked integrated circuit device, control signals from a test controller external to the stacked integrated circuit device.

16. The method of claim 15, wherein the interface by which the control signals are received is a joint test action group (JTAG) interface.

17. The method of claim 1, wherein the second die comprises second test logic that is equivalent to the test logic of the first die, wherein the method further comprises testing the stacked integrated circuit device with the second test logic deactivated.

18. A stacked integrated circuit device comprising:
a first die comprising testing logic and first testing apparatus;
a second die comprising second testing apparatus; and
a plurality of through silicon vias formed in a substrate of the first die and providing electrical communication between the testing logic and the second testing apparatus, wherein the testing logic is configured to:
send first testing control signals to the first testing apparatus on the first die to run a first one or more tests for testing functional logic or memory of the first die; and
send second testing control signals to the second testing apparatus on the second die by the through silicon vias,
wherein the first testing apparatus is configured to, in response to the first testing control signals, run a first one or more tests for testing functional logic or memory of the first die,
wherein the second testing apparatus is configured to, in response to the second testing control signals, run a second one or more tests for testing functional logic or memory of the second die.

19. The stacked integrated circuit device of claim 18, wherein the first testing apparatus comprises memory test circuitry of the first die, wherein the first testing control signals comprise signals configured to cause the memory test circuitry of the first die to apply first test patterns to the memory of the first die, and
wherein the second testing control signals comprise signals configured to cause memory test circuitry of the second die to apply second test patterns to the memory of the second die.

20. The stacked integrated circuit device of claim 18, further comprising a first flip flop in a first scan chain of the first die and a second flip flop in the first scan chain, wherein a path passes through a plurality of connections between the first die and the second die.

21. The stacked integrated circuit device of claim 20, wherein the testing logic is configured to test the plurality of connections by causing a first scan chain test to be run such that test data is provided from the first flip flop to the second flip flop by the path.

22. The stacked integrated circuit device of claim 21, further comprising a further path that does not pass through the plurality of connections, wherein the testing logic is further configured to cause a second scan chain test to be run such that test data is provided from the first flip flop to the second flip flop by the further path.

23. The stacked integrated circuit device of claim 18, wherein the first die further comprises first scan chains, and wherein the second die further comprises second scan chains, and
wherein the first testing apparatus is configured to input first test vectors to the first scan chains, and
wherein the second testing apparatus is configured to input second test vectors to the second scan chains.

* * * * *